United States Patent
Nee

(10) Patent No.: US 7,374,805 B2
(45) Date of Patent: *May 20, 2008

(54) METAL ALLOYS FOR THE REFLECTIVE OR THE SEMI-REFLECTIVE LAYER OF AN OPTICAL STORAGE MEDIUM

(75) Inventor: Han H. Nee, Newport Beach, CA (US)

(73) Assignee: Target Technology Company, LLC, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/322,861

(22) Filed: Dec. 30, 2005

(65) Prior Publication Data

US 2006/0134368 A1    Jun. 22, 2006

Related U.S. Application Data

(63) Continuation-in-part of application No. 10/825,779, filed on Apr. 16, 2004, now Pat. No. 7,018,696, which is a continuation-in-part of application No. 11/126,412, filed on May 10, 2005, which is a continuation of application No. 10/822,619, filed on Apr. 12, 2004, now Pat. No. 6,905,750, which is a continuation-in-part of application No. 10/457,935, filed on Jun. 10, 2003, now Pat. No. 6,852,384, which is a continuation-in-part of application No. 10/409,037, filed on Apr. 8, 2003, now abandoned, which is a continuation of application No. 09/834,775, filed on Apr. 13, 2001, now Pat. No. 6,544,616.

(60) Provisional application No. 60/463,837, filed on Apr. 18, 2003, provisional application No. 60/219,843, filed on Jul. 21, 2000.

(51) Int. Cl.
*B32B 3/02* (2006.01)

(52) U.S. Cl. .................. 428/64.1; 428/64.4; 428/64.5; 430/270.12; 430/270.13

(58) Field of Classification Search ............... 428/64.1, 428/64.4, 64.5; 430/270.12, 270.13
See application file for complete search history.

(56) References Cited

U.S. PATENT DOCUMENTS 4,240,021 A    12/1980 Kashima et al.

(Continued)

FOREIGN PATENT DOCUMENTS

CA    2401389    7/2002

(Continued)

OTHER PUBLICATIONS

JP XP-002260270, Jun. 12, 1992, Casio Computer Co.

(Continued)

*Primary Examiner*—Elizabeth Mulvaney
(74) *Attorney, Agent, or Firm*—Woodard, Emhardt, Moriarity, McNett & Henry, LLP

(57) ABSTRACT

A silver-based alloy thin film is provided for the highly reflective or semi-reflective coating layer of optical discs. Elements that can be added to silver to produce useful silver alloys include zinc, aluminum, copper, manganese, germanium, yttrium, bismuth, scandium, and cobalt. These alloys have moderate to high reflectivity and reasonable corrosion resistance in the ambient environment.

56 Claims, 10 Drawing Sheets

U.S. PATENT DOCUMENTS

| | | |
|---|---|---|
| 4,404,656 A | 9/1983 | Cornet |
| 4,405,994 A | 9/1983 | Cornet |
| 4,450,553 A | 5/1984 | Holster |
| 4,681,983 A | 7/1987 | Markvart et al. |
| 4,709,363 A | 11/1987 | Dirks |
| 4,998,239 A | 3/1991 | Strandjord |
| 5,090,009 A | 2/1992 | Hamada |
| 5,093,174 A | 3/1992 | Suzuki |
| 5,171,392 A | 12/1992 | Iida |
| 5,325,351 A | 6/1994 | Uchiyama |
| 5,391,462 A | 2/1995 | Arioka |
| 5,415,914 A | 5/1995 | Arioka |
| 5,419,939 A | 5/1995 | Arioka |
| 5,498,507 A | 3/1996 | Handa |
| 5,620,767 A | 4/1997 | Harigaya |
| 5,640,382 A | 6/1997 | Florczak |
| 5,641,606 A | 6/1997 | Suzuki et al. |
| 5,673,251 A | 9/1997 | Suzuki |
| 5,719,006 A | 2/1998 | Ohkubo |
| 5,741,603 A | 4/1998 | Yasuda |
| 5,742,367 A | 4/1998 | Kozaki et al. |
| 5,753,413 A | 5/1998 | Nishida |
| 5,820,994 A | 10/1998 | Gotoh |
| 5,853,872 A | 12/1998 | Shimamori |
| 5,882,759 A | 3/1999 | Hirotsune et al. |
| 5,948,497 A | 9/1999 | Hatwar |
| 6,007,887 A | 12/1999 | Hatwar |
| 6,007,889 A | 12/1999 | Nee |
| 6,014,196 A | 1/2000 | Anzaki et al. |
| 6,228,457 B1 | 5/2001 | Ueno |
| 6,232,036 B1 | 5/2001 | Suzuki |
| 6,242,068 B1 | 6/2001 | Preuss |
| 6,280,811 B1 | 8/2001 | Nee |
| 6,292,457 B1 | 9/2001 | Preuss |
| 6,351,446 B1 | 2/2002 | Weinzerl |
| 6,451,402 B1 | 9/2002 | Nee |
| 6,544,616 B2 | 4/2003 | Nee |
| 6,764,735 B2 | 7/2004 | Nee |
| 6,790,503 B2 | 9/2004 | Nee |
| 6,841,219 B2 | 1/2005 | Nee |
| 6,852,384 B2 | 2/2005 | Nee |
| 6,896,947 B2 | 5/2005 | Nee |
| 6,905,750 B2 | 6/2005 | Nee |
| 2002/0034603 A1 | 3/2002 | Nee |
| 2002/0122913 A1 | 9/2002 | Nee |
| 2002/0150772 A1 | 10/2002 | Nakai |
| 2003/0003395 A1 | 1/2003 | Yuzurihara |
| 2003/0008236 A1 | 1/2003 | Yamada |
| 2003/0008485 A1 | 1/2003 | Meler et al. |
| 2003/0081168 A1 | 5/2003 | Li et al. |
| 2003/0081537 A1 | 5/2003 | Shinotsuka |
| 2003/0180495 A1 | 9/2003 | Ito |
| 2003/0215598 A1 | 11/2003 | Nee |
| 2003/0227250 A1 | 12/2003 | Nee |
| 2004/0005432 A1 | 1/2004 | Ridout |
| 2004/0028912 A1 | 2/2004 | Tauchi |
| 2004/0048193 A1 | 3/2004 | Lichtenberger |
| 2004/0048251 A1 | 3/2004 | Vargeese |
| 2004/0161630 A1 | 8/2004 | Specht |
| 2004/0226818 A1 | 11/2004 | Takagi |
| 2004/0238356 A1 | 12/2004 | Matsuzaki et al. |
| 2004/0253137 A1 | 12/2004 | Gehlert |
| 2005/0048251 A1 | 3/2005 | Lichtenberger |

FOREIGN PATENT DOCUMENTS

| | | |
|---|---|---|
| DE | 37 28 106 A1 | 3/1989 |
| DE | 44 14 107 A1 | 10/1994 |
| EP | 0 406 569 A2 | 1/1991 |
| EP | 0 720 159 A2 | 7/1996 |
| EP | 0 737 966 A1 | 10/1996 |
| EP | 0 745 985 A2 | 12/1996 |
| EP | 0 798 401 A2 | 10/1997 |
| EP | 0 594 516 B1 | 5/1998 |
| EP | 0 867 868 A2 | 9/1998 |
| EP | 0 917 137 A1 | 5/1999 |
| EP | 1 069 194 A1 | 1/2001 |
| EP | 1 103 758 A2 | 5/2001 |
| EP | 1 174 868 A | 1/2002 |
| EP | 1 589 531 A | 10/2005 |
| JP | 59208789 | 11/1984 |
| JP | 60030183 A | 2/1985 |
| JP | 61 019747 A | 1/1986 |
| JP | 61 069935 A | 4/1986 |
| JP | 01307278 A | 12/1989 |
| JP | 01310578 A | 12/1989 |
| JP | 02-192046 | 7/1990 |
| JP | 403025737 | 2/1991 |
| JP | 03286432 A | 12/1991 |
| JP | 03288346 | 12/1991 |
| JP | 04176039 | 6/1992 |
| JP | 324133/92 | 11/1992 |
| JP | 04324133 | 11/1992 |
| JP | 05012710 A1 | 1/1993 |
| JP | 05021710 A | 1/1993 |
| JP | 05073975 A | 3/1993 |
| JP | 325406/94 | 5/1993 |
| JP | 05215634 | 9/1994 |
| JP | 06274954 A | 9/1994 |
| JP | 05115763 | 11/1994 |
| JP | 06325408 A | 11/1994 |
| JP | 07-006427 | 1/1995 |
| JP | 06107566 | 1/1995 |
| JP | 07003363 A | 1/1995 |
| JP | 07014221 A | 1/1995 |
| JP | 05195011 | 2/1995 |
| JP | 07050035 A | 2/1995 |
| JP | 05179739 | 3/1995 |
| JP | 05215547 | 3/1995 |
| JP | 05233110 | 3/1995 |
| JP | 07073527 A | 3/1995 |
| JP | 07076171 A | 3/1995 |
| JP | 07085520 A | 3/1995 |
| JP | 05249821 | 4/1995 |
| JP | 05251824 | 4/1995 |
| JP | 05277809 | 4/1995 |
| JP | 07090566 A | 4/1995 |
| JP | 07104424 A | 4/1995 |
| JP | 07105575 A | 4/1995 |
| JP | 07110964 A | 4/1995 |
| JP | 05312129 | 6/1995 |
| JP | 07166336 A | 6/1995 |
| JP | 07 207385 | 8/1995 |
| JP | 06065594 | 10/1995 |
| JP | 07036958 | 10/1995 |
| JP | 07252649 A | 10/1995 |
| JP | 07262627 A | 10/1995 |
| JP | 1995-320324 | 12/1995 |
| JP | 06111259 | 12/1995 |
| JP | 06123718 | 12/1995 |
| JP | 07116045 | 12/1995 |
| JP | 07320299 A | 12/1995 |
| JP | 07320302 A | 12/1995 |
| JP | 07334873 A | 12/1995 |
| JP | 06141602 | 1/1996 |
| JP | 06143042 | 1/1996 |
| JP | 08007330 A | 1/1996 |
| JP | 08007365 A | 1/1996 |
| JP | 06206963 | 3/1996 |
| JP | 06225691 | 3/1996 |
| JP | 08063791 A | 3/1996 |
| JP | 08077624 A | 3/1996 |
| JP | 06253971 | 5/1996 |
| JP | 07223758 | 5/1996 |

| | | |
|---|---|---|
| JP | 08124211 A | 5/1996 |
| JP | 08124213 A | 5/1996 |
| JP | 07038628 | 9/1996 |
| JP | 08235641 A | 9/1996 |
| JP | 273193/96 | 10/1996 |
| JP | 07076177 | 10/1996 |
| JP | 08273192 A | 10/1996 |
| JP | 08273193 | 10/1996 |
| JP | 08297858 A | 11/1996 |
| JP | 08-338199 | 12/1996 |
| JP | 07139459 | 12/1996 |
| JP | 08332772 A | 12/1996 |
| JP | 09-007355 | 1/1997 |
| JP | 09007226 A | 1/1997 |
| JP | 09162428 A | 6/1997 |
| JP | 25515/99 | 7/1997 |
| JP | 09-212915 | 8/1997 |
| JP | 08014667 | 8/1997 |
| JP | 08019648 A | 8/1997 |
| JP | 08035523 | 8/1997 |
| JP | 09204686 A | 8/1997 |
| JP | 09204690 A | 8/1997 |
| JP | 08050199 | 9/1997 |
| JP | 09245373 A | 9/1997 |
| JP | 08115029 | 11/1997 |
| JP | 09306029 A | 11/1997 |
| JP | 08149725 | 12/1997 |
| JP | 09312038 A | 12/1997 |
| JP | 10 011799 A2 | 1/1998 |
| JP | 10 017799 A | 1/1998 |
| JP | 11 12734 A | 1/1998 |
| JP | 08158147 | 1/1998 |
| JP | 10 177742 | 6/1998 |
| JP | 10-177742 A | 6/1998 |
| JP | 10282906 A | 10/1998 |
| JP | 10-293945 | 11/1998 |
| JP | H10-293945 | 11/1998 |
| JP | 11 025515 | 1/1999 |
| JP | 411012734 | 1/1999 |
| JP | 3017125 B2 | 12/1999 |
| JP | 2000 057627 A | 2/2000 |
| JP | 200057627 | 2/2000 |
| JP | 2000 228032 | 8/2000 |
| JP | 2002015464 | 1/2002 |
| JP | 2002 151720 A | 5/2002 |
| JP | 2000 402146 | 7/2002 |
| JP | 2002 226927 A | 8/2002 |
| JP | 2002 231596 | 8/2002 |
| JP | 2002 233283 | 8/2002 |
| JP | 2002 239972 | 8/2002 |
| JP | 2002226927 | 8/2002 |
| JP | 2002235130 | 8/2002 |
| JP | 2002319185 | 10/2002 |
| JP | 2002323611 | 11/2002 |
| JP | 2002-361117 | 12/2002 |
| JP | 2003-003643 | 1/2003 |
| JP | 2003 004586 | 1/2003 |
| JP | 2003-122314 | 4/2003 |
| JP | 2003-139293 | 5/2003 |
| WO | WO 97/22968 | 6/1997 |
| WO | WO 00/21079 | 4/2000 |
| WO | WO 02/054396 A1 | 7/2002 |

OTHER PUBLICATIONS

SPIE Conference Proceeding, Nov. 1996, vol./Issue No. vol. 2890, pp. 2-9.
Journal of the Optical Society of America, Jun. 1954, vol./Issue No. vol. 44, No. 6, pp. 429-438.
"Film Deposition Techniques", Encyclopedia of Chemical Technology, 3rd Ed., vol./Issue No. 10, pp. 247-283, Kirk-Othmer, no date.
Bond, W.L., "Notes on Solution of Problems in Odd Job Vapor Coating", J. Optical Soc. Of Amer., Jun. 1954, vol./Issue No. 44-6, pp. 429-438.
Hirota, Kusato et al., Reliability of the Phase Change Optical Disk, Japanese Journal of Applied Physics, Oct. 1997, vol./Issue No. vol. 36, Part 1, No. 10, pp. 8398-8402, Publication Board, Japanese Journal of Applied Phy Tokyo Japan.
Nishida, Testuya et al., "An ultra-hig-capacity multi-data-layer ROM", SPIE Conference Proceeding, Nov. 1998, vol./Issue No. 2890, pp. 2-9.

ary is the combination of a substance with silver in very small amounts to produce a precious-metal-like luster with other desirable properties and not necessarily for a precious appearance.

METAL ALLOYS FOR THE REFLECTIVE OR THE SEMI-REFLECTIVE LAYER OF AN OPTICAL STORAGE MEDIUM

PRIORITY CLAIM

This application is a continuation-in-part of U.S. patent application Ser. No. 10/825,779 filed on filed on Apr. 16, 2004, now U.S. Pat. No. 7,018,696 which claims the benefit of U.S. Provisional Patent Application No. 60/463,837 filed on Apr. 18, 2003, this Application is also a continuation-in-part of patent application Ser. No. 11/126,412 filed on May 10, 2005, which is a continuation of patent application Ser. No. 10/822,619 filed on Apr. 12, 2004, now U.S. Pat. No. 6,905,750 issued on Jul. 14, 2005, which is a continuation-in-part of application Ser. No. 10/457,935 filed on Jun. 10, 2003, now U.S. Pat. No. 6,852,384 issued on Feb. 8, 2005, which is a continuation-in-part of patent application Ser. No. 10/409,037 filed on Apr. 8, 2003, (abandoned on Mar. 16, 2004), which is a continuation of application Ser. No. 09/834,775 filed on Apr. 13, 2001, now U.S. Pat. No. 6,544,616 B2, issued on Apr. 8, 2003, which claims the benefit of Provisional Patent Application No. 60/219,843 filed on Jul. 21, 2000, all of which are hereby incorporated by reference in their entirety.

FIELD OF THE INVENTION

This invention relates to reflective layers or semi-reflective layers used in optical storage media that comprise silver-based alloys.

BACKGROUND OF THE INVENTION

Four layers are generally present in the construction of a conventional, prerecorded, optical disc such as compact audio disc. A first layer is usually made from optical grade, polycarbonate resin. This layer is manufactured by well-known techniques that usually begin by injection or compression molding the resin into a disc. The surface of the disc is molded or stamped with extremely small and precisely located pits and lands. These pits and lands have a predetermined size and, as explained below, are ultimately the vehicles for storing information on the disc.

After stamping, an optically reflective layer is placed over the information pits and lands. The reflective layer is usually made of aluminum or an aluminum alloy and is typically between about 40 to about 100 nanometers (nm) thick. The reflective layer is usually deposited by one of many well-known vapor deposition techniques such as sputtering or thermal evaporation. *Kirk-Othmer, Encyclopedia of Chemical Technology*, $3^{rd}$ ed. Vol. 10, pp. 247 to 283, offers a detailed explanation of these and other deposition techniques such as glow discharge, ion plating, and chemical vapor deposition, and this specification hereby incorporates that disclosure by reference.

Next, a solvent-based or an UV (ultraviolet) curing-type resin is applied over the reflective layer, which is usually followed by a label. The third layer protects the reflective layer from handling and the ambient environment. And the label identifies the particular information that is stored on the disc, and sometimes, may include artwork.

The information pits residing between the polycarbonate resin and the reflective layer usually take the form of a continuous spiral. The spiral typically begins at an inside radius and ends at an outside radius. The distance between any 2 spirals is called the "track pitch" and is usually about 1.6 microns for compact audio disc. The length of one pit or land in the direction of the track is from about 0.9 to about 3.3 microns. All of these details are commonly known for compact audio discs and reside in a series of specifications that were first proposed by Philips NV of Holland and Sony of Japan as standards for the industry.

The disc is read by pointing a laser beam through the optical grade polycarbonate substrate and onto the reflective layer with sufficiently small resolution to focus on the information pits. The pits have a depth of about ¼ of the wavelength of the laser light, and the light generally has a wavelength in the range of about 780 to 820 nanometers. Destructive (dark) or constructive (bright) interference of the laser light is then produced as the laser travels along the spiral track, focusing on an alternating stream of pits and lands in its path.

This on and off change of light intensity from dark to bright or from bright to dark forms the basis of a digital data stream of 1 and 0's. When there is no light intensity change in a fixed time interval, the digital signal is "0," and when there is light intensity change from either dark to bright or bright to dark, the digital signal is "1." The continuous stream of ones and zeros that results is then electronically decoded and presented in a format that is meaningful to the user such as music or computer programming data.

As a result, it is important to have a highly reflective coating on the disc to reflect the laser light from the disc and onto a detector in order to read the presence of an intensity change. In general, the reflective layer is usually aluminum, copper, silver, or gold, all of which have a high optical reflectivity of more than 80 percent from 650 nm to 820 nm wavelength. Aluminum and aluminum alloys are commonly used because they have a comparatively lower cost, adequate corrosion resistance, and are easily placed onto the polycarbonate disc.

Occasionally and usually for cosmetic reason, a gold or copper based alloy is used to offer the consumer a "gold" colored disc. Although gold naturally offers a rich color and satisfies all the functional requirements of a highly reflective layer, it is comparatively much more expensive than aluminum. Therefore, a copper-based alloy that contains zinc or tin is sometimes used to produce the gold colored layer. But unfortunately, the exchange is not truly satisfactory because the copper alloy's corrosion resistance, in general, is considered worse than aluminum, which results in a disc that has a shorter life span than one with an aluminum reflective layer.

For the convenience of the reader, additional details in the manufacture and operation of an optically readable storage system can be found in U.S. Pat. No. 4,998,239 to Strandjord et al. and U.S. Pat. No. 4,709,363 to Dirks et al., the disclosures of which are hereby incorporated by reference.

Another type of disc in the compact disc family that has become popular is the recordable compact disc or "CD-R." This disc is similar to the CD described earlier, but it has a few changes. The recordable compact disc begins with a continuous spiral groove instead of a continuous spiral of pits and has a layer of organic dye between the polycarbonate substrate and the reflective layer. The disc is recorded by periodically focusing a laser beam into the grooves as the laser travels along the spiral track. The laser heats the dye to a high temperature, which in turn places pits in the groove that coincide with an input data stream of ones and zeros by periodically deforming and decomposing the dye.

For the convenience of the reader, additional details regarding the operation and construction of these recordable discs can be found in U.S. Pat. No. 5,325,351 to Uchiyama et al., and U.S. Pat. Nos. 5,391,462; 5,415,914; and 5,419,939 to Arioka et al., and U.S. Pat. No. 5,620,767 to Harigaya et al., the disclosures of which are hereby incorporated into this specification by reference.

The key component of a CD-R disc is the organic dye, which is made from solvent and one or more organic compounds from the cyanine, phthalocyanine or azo family. The disc is normally produced by spin coating the dye onto the disc and sputtering the reflective layer over the dye after the dye is sufficiently dry. But because the dye may contain halogen ions or other chemicals that can corrode the reflective layer, many commonly used reflective layer materials such as aluminum may not be suitable to give the CD-R disc a reasonable life span. So being, frequently gold must be used to manufacture a recordable CD. But while gold satisfies all the functional requirements of CD-R discs, it is a very expensive solution.

Recently, other types of recordable optical disks have been developed. These optical disks use a phase-change or magneto-optic material as the recording medium. An optical laser is used to change the phase or magnetic state (microstructural change) of the recording layer by modulating a beam focused on the recording medium while the medium is rotated to produce microstructural changes in the recording layer. During playback, changes in the intensity of light from the optical beam reflected through the recording medium are sensed by a detector. These modulations in light intensity are due to variations in the microstructure of the recording medium produced during the recording process. Some phase-change and/or magneto-optic materials may be readily and repeatedly transformed from a first state to a second state and back again with substantially no degradation. These materials may be used as the recording media for a compact disc-rewritable disc, or commonly known as CD-RW.

To record and read information, phase change discs utilize the recording layer's ability to change from a first dark to a second light phase and back again. Recording on these materials produces a series of alternating dark and light spots according to digital input data introduced as modulations in the recording laser beam. These light and dark spots on the recording medium correspond to 0's and 1's in terms of digital data. The digitized data is read using a low laser power focused along the track of the disc to play back the recorded information. The laser power is low enough such that it does not further change the state of the recording media but is powerful enough such that the variations in reflectivity of the recording medium may be easily distinguished by a detector. The recording medium may be erased for re-recording by focussing a laser of intermediate power on the recording medium. This returns the recording medium layer to its original or erased state. A more detailed discussion of the recording mechanism of optically recordable media can be found in U.S. Pat. Nos. 5,741,603; 5,498,507; and 5,719,006 assigned to the Sony Corporation, the TDK Corporation, and the NEC Corporation, all of Tokyo, Japan, respectively, the disclosures of which are incorporated herein by reference in their entirety.

Still another type of disc in the optical disc family that has become popular is a prerecorded optical disc called the digital videodisc or "DVD." This disc has two halves. Each half is made of polycarbonate resin that has been injection or compression molded with pit information and then sputter coated with a reflective layer, as described earlier. These two halves are then bonded or glued together with an UV curing resin or a hot melt adhesive to form the whole disc. The disc can then be played from both sides as contrasted from the compact disc or CD where information is usually obtained only from one side. The size of a DVD is about the same as a CD, but the information density is considerably higher. The track pitch is about 0.7 micron and the length of the pits and lands is from approximately 0.3 to 1.4 microns.

One variation of the DVD family of discs is the DVD-dual layer disc. This disc also has two information layers; however, both layers are played back from one side. In this arrangement, the highly reflective layer is usually the same as that previously described. But the second layer is only semi-reflective with a reflectivity in the range of approximately 18 to 30 percent at 650 nm wavelength. In addition to reflecting light, this second layer must also pass a substantial amount of light so that the laser beam can reach the highly reflective layer underneath and then reflect back through the semi-reflective layer to the signal detector.

In a continued attempt to increase the storage capacity of optical discs, a multi-layer disc can be constructed as indicated in the publication "SPIE Conference Proceeding Vol. 2890, page 2-9, November, 1996" where a tri-layer or a quadri-layer optical disc was revealed. All the data layers were played back from one side of the disc using laser light at 650 nm wavelength. A double-sided tri-layered read-only-disc that included a total of six layers can have a storage capacity of about 26 gigabytes of information.

More recently, a blue light emitting laser diode with wavelength of 400 nm has been made commercially available. The new laser will enable much denser digital video-disc data storage. While current DVD using 650 nm red laser can store 4.7 GB per side, the new blue laser will enable 12 GB per side, enough storage space for about 6 hours of standard-resolution video and sound. With a multi-layer disc, there is enough capacity for a featured movie in the high-definition digital video format.

Recent advances in the development of high reflective and semi-reflective materials for use as both semi-reflective and highly reflective layers in DVD-9s has made it feasible to create tri-layer and even quadruple-layer optical discs with all playback information layers on the same side of the disc. See for example, U.S. Pat. Nos. 6,007,889, and 6,280,811. Thus multiple-layer disc can be constructed and manufactured at low cost. Combined with objective lens having a numerical aperture (NA) of 0.60, and playback lasers having a wavelength of about 650 nm, multiple-layer optical storage devices with the capacity to store 14 gigabytes of information (DVD-14) or 18 gigabytes (DVD-18) of information storage capacity can be made.

Various formats for the next generation optical discs have been proposed. One of these is referred to so as a "Blu-ray"disc. The Blu-ray disc system is characterized by a playback laser operating at a wavelength of about 405 nm (blue light) and an objective lens with a numerical aperture of 0.85. The storage capacity of this device, used with one information layer, is estimated to be about 25 gigabytes for the prerecorded format. Such devices have track pitch values in the 0.32 µm range and channel bit length on the order of 0.05 µm.

Because the focal depth of an objective lens with a NA of 0.85 is typically less than one micron, the tolerance of the optical path length variation is drastically reduced relative to currently used systems. Thus a cover layer about 100 microns thick (the distance is measured from the surface of the disc to the information layer) has been proposed. The variation of the thickness of this cover layer is extremely critical to the success of this system. For example, a 2 or 3 micron thickness variation in the cover layer will introduce very high spherical aberration in the playback signal, potentially degrading the signal to an unacceptable low level.

Another major problem with the Blu-ray format is that the current generation of production equipment used for DVDs cannot be used to produce discs with the Blu-ray format, because the proposed format is too different from currently used DVD format. The need to invest in new equipment to manufacture Blu-ray discs substantially increases the cost of making the Blu-ray disc, and presents another obstacle to adopting the Blu-ray disc system as the standard for the next generation of DVD.

In part, because of the aforementioned problems associated with the Blu-ray disc, another format for the next generation of DVD has been proposed. This proposed format is sometimes referred to as the, "Advanced Optical Disc" (AOD).

The AOD format preserves some of the features of the currently used DVD, for example, an AOD comprises two 0.6 mm thick half-discs glued together to create a symmetrical structure. The proposed AOD system uses a playback laser with a wavelength of 405 nm and an objective lens with a NA of about 0.65. The storage capacity of the prerecorded type of AOD disc with one information layer is about 15 gigabytes. Although manufacturing an AOD disc is less complicated and less challenging than manufacturing a Blu-ray disc, AOD suffers one drawback. The playback signal quality of an AOD disc is strongly dependant upon the flatness of the disc. In order to deal with the variation of disc flatness introduced in the mass production of AOD discs, a tilt servo mechanism in the player is most likely required. The need for this mechanism will increase the cost of players designed to read AOD discs.

Currently, there is an interest in adapting CD-RW techniques to the DVD field to produce a rewritable DVD (DVD-RW). Some difficulties in the production of a DVD-RW have arisen due to the higher information density requirements of the DVD format. For example, the reflectivity of the reflective layer must be increased relative to that of the standard DVD reflective layer to accommodate the reading, writing, and erasing requirements of the DVD-RW format. Also, the thermal conductivity of the reflective layer must also be increased to adequately dissipate the heat generated by both the higher laser power requirements to write and erase information and the microstructural changes occurring during the information transfer process. The potential choice of the reflective layer is currently pure gold, pure silver and aluminum alloys. Gold seems to have sufficient reflectivity, thermal conductivity, and corrosion resistance properties to work in a DVD-RW disk. Additionally, gold is relatively easy to sputter into a coating of uniform thickness. But once again, gold is also comparatively more expensive than other metals, making the DVD-RW format prohibitively expensive. Pure silver has higher reflectivity and thermal conductivity than gold, but its corrosion resistance is relatively poor as compared to gold. Aluminum alloy's reflectivity and thermal conductivity is considerably lower than either gold or silver, and therefore it is not necessarily a good choice for the reflective layer in DVD-RW or DVD+RW.

For the convenience of the reader, additional details regarding the manufacture and construction of DVD discs can be found in U.S. Pat. No. 5,640,382 to Florczak et al. the disclosure of which is hereby incorporated by reference.

Therefore, what is needed are some new alloys that have the advantages of gold when used as a reflective layer or as a semi-reflective layer in an optical storage medium, but are not as expensive as gold. These new alloys should also have better corrosion resistance than pure silver. The current invention addresses that need.

SUMMARY OF THE INVENTION

One embodiment provides metallic alloys for use in thin film reflective layers, these alloys have high reflectivity, sputtering characteristics similar to gold, are corrosion resistant, and are generally less expensive than gold. A number of these alloys can also be used as semi-reflective layers (coatings) in optical storage devices such as DVD-dual layer devices.

One embodiment provides silver-based alloys with sufficient chemical, thermal and optical properties to satisfy the functional requirements of the reflective layer in a DVD-RW or DVD+RW disc and other current or future generations of optical discs in which reflectivity, corrosion resistance, and ease of application are all important requirements for a low cost and high performance product.

DESCRIPTION OF THE PREFERRED EMBODIMENTS

Figure 1:
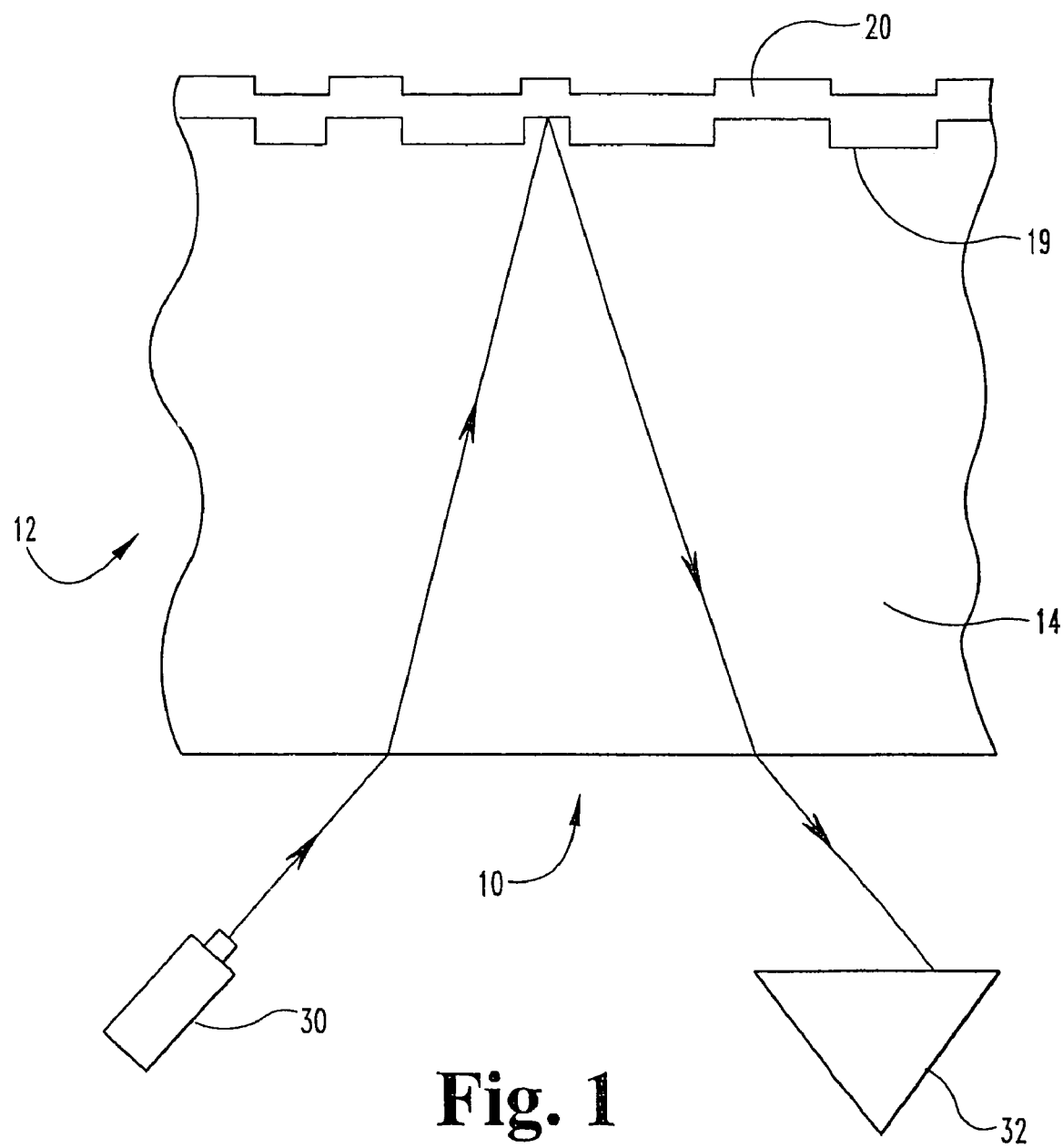
FIG. 1 is an optical storage system according to one embodiment.

Specific language is used in the following description and examples to publicly disclose the invention and to convey its principles to others. No limits on the breadth of the patent rights based simply on using specific language are intended.

Also included are any alterations and modifications to the descriptions that should normally occur to one of average skill in this technology.

As used in this specification the term "atomic percent" or "a/o percent" refers to the ratio of atoms of a particular element or group of elements to the total number of atoms that are identified to be present in a particular alloy. For example, an alloy that is 15 atomic percent element "A" and 85 atomic percent element "B" could also be referenced by a formula for that particular alloy: $A_{0.15}B_{0.85}$.

As used herein the term "of the amount of silver present" is used to describe the amount of a particular additive that is included in the alloy. Used in this fashion, the term means that the amount of silver present, without consideration of the additive, is reduced by the amount of the additive that is present to account for the presence of the additive in a ratio. For example, if the relationship between Ag and an element "X" is $Ag_{0.85}X_{0.15}$ (respectively 85 a/o percent and 15 a/o percent) without the considering the amount of the additive that is present, and if an additive "B" is present at a level 5 atomic percent "of the amount of silver present"; then the relationship between Ag, X, and B is found by subtracting 5 atomic percent from the atomic percent of silver, or the relationship between Ag, X, and B is $Ag_{0.80}X_{0.15}B_{0.05}$ (respectively 80 a/o percent silver, 15 a/o percent "X", and 5 a/o percent "B").

As used in this specification the term "adjacent" refers to a spatial relationship and means "nearby" or "not distant." Accordingly, the term "adjacent" as used in this specification does not require that items so identified are in contact with one another and that they may be separated by other structures. For example, referring to FIG. 5, layer 424 is "adjacent" or "nearby" layer 422, just as layer 414 is "adjacent" or "nearby" layer 422.

One embodiment comprises multi-layer metal/substrate compositions that are used as optical data storage media. One embodiment is shown in FIG. 1 as optical data storage system 10. Optical storage medium 12 comprises a transparent substrate 14, and a highly reflective thin film layer or coating 20 on a first data pit pattern 19. An optical laser 30 emits an optical beam toward medium 12, as shown in FIG. 1. Light from the optical beam that is reflected by thin film layer 20 is sensed by detector 32, which senses modulations in light intensity based on the presence or absence of a pit or land in a particular spot on the thin film layer. The disc is unique in that one of the alloys presented below is deposited upon the information pits and lands and is used as the highly reflective thin film 20. In one alternative (not shown), the disc may be varied by attaching two optical storage media 12 back-to-back, that is, with each transparent substrate 14 facing outward.

Figure 2:
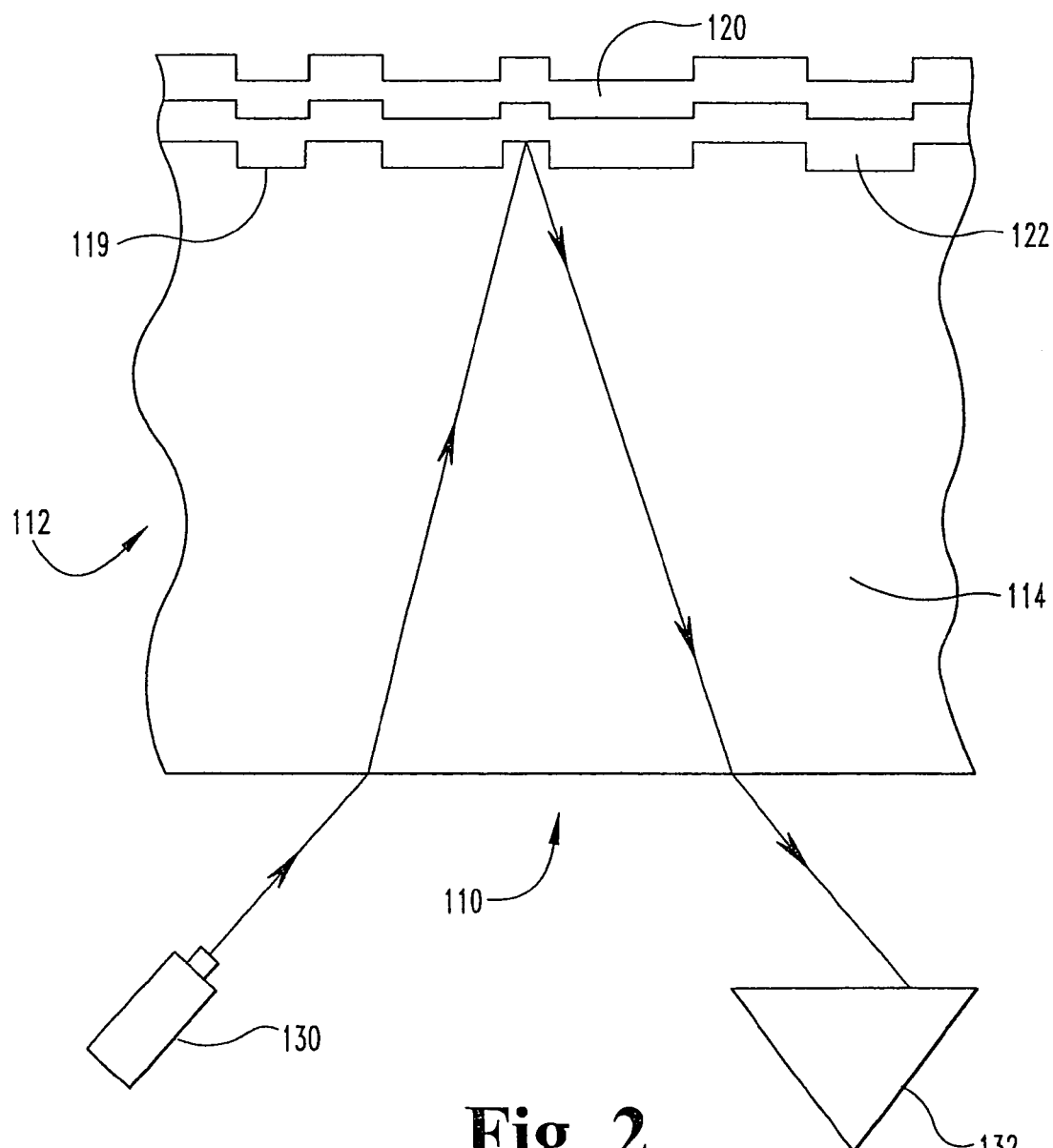
FIG. 2 is an optical storage system according to another embodiment, wherein an organic dye is used as a recording layer.

Another embodiment is shown in FIG. 2 as optical data storage system 110. Optical storage medium 112 comprises a transparent substrate 114, and a highly reflective thin film layer 120, over a layer of dye 122, placed over a first pattern 119. An optical laser 130 emits an optical beam toward medium 112, as shown in FIG. 2. As discussed earlier, data is placed upon the disc by deforming portions of the dye layer with a laser. Thereafter, the disc is played by light from the optical beam, which is reflected by thin film layer 120 and sensed by detector 132. Detector 132 senses modulations in light intensity based on the presence or absence of a deformation in the dye layer. The disc is unique in that one of the alloys presented below is deposited over the dye layer 122 and is used as the highly reflective thin film or coating 120. In one alternative (not shown), the disc may be varied by attaching two optical storage media 112 back-to-back, that is, with each transparent substrate 114 facing outward.

Figure 3:
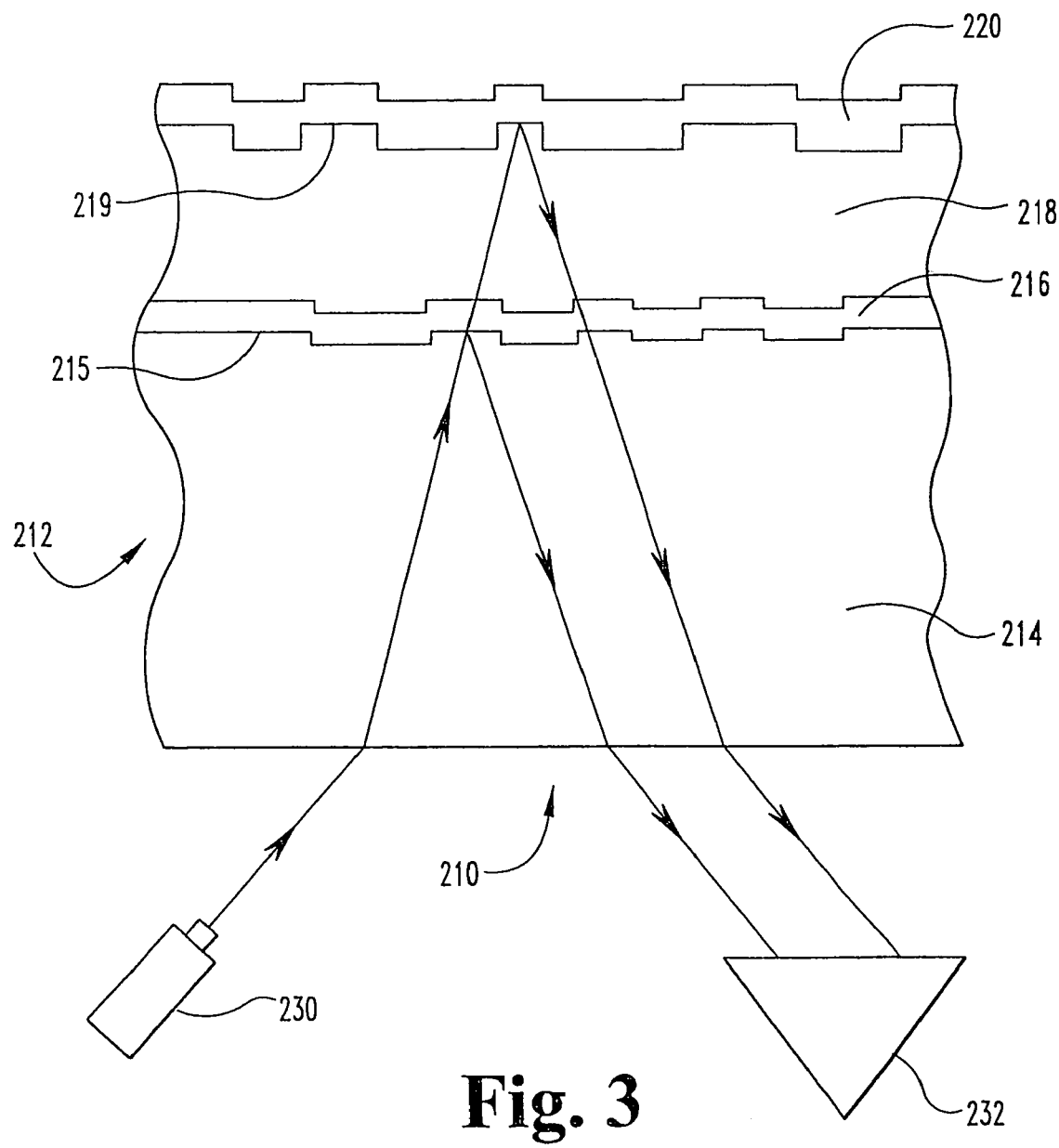
FIG. 3 is an optical storage system according to another embodiment having two layers of information pits where the playback of both layers is from one side.

Another embodiment is shown in FIG. 3 as optical data storage system 210. Optical storage medium 212 comprises a transparent substrate 214, a partially reflective thin film layer or coating 216 on a first data pit pattern 215, a transparent spacer layer 218, and a highly reflective thin film layer or coating 220 on a second data pit pattern 219. An optical laser 230 emits an optical beam toward medium 212, as shown in FIG. 3. Light from the optical beam that is reflected by either thin film layer 216 or 220 is sensed by detector 232, which senses modulations in light intensity based on the presence or absence of a pit in a particular spot on the thin film layers. The disc is unique in that one of the alloys presented below is deposited upon the information pits and lands and used as the highly reflective thin film 220 or semi-reflective layer 216. In another alternative (not shown), the disc may be varied by attaching two optical storage media 212 back-to-back, that is, with each transparent substrate 214 facing outward. The attachment method could be by UV cured adhesive, hot melt adhesive or other type of adhesives.

Figure 4:
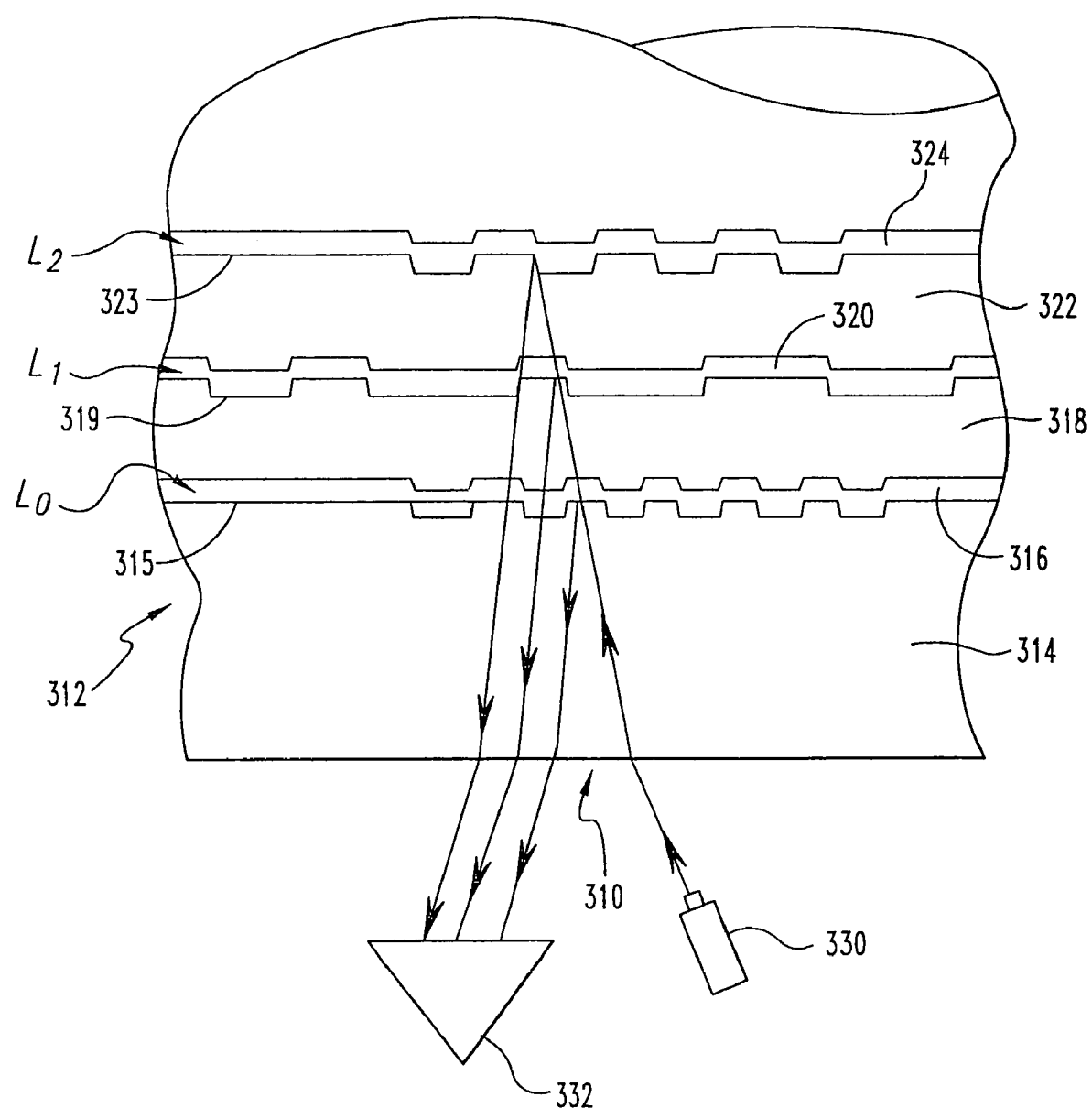
FIG. 4 is an optical storage system according to another embodiment having three layers of information pits where the playback of all three layers is from one side.

Another embodiment is shown in FIG. 4 as optical data storage system 310. Optical storage medium 312 comprises a transparent substrate 314, a partially reflective thin film layer or coating 316 or layer "zero" on a first data pit pattern 315, a transparent spacer layer 318, another partially reflective thin film layer or coating 320 or layer "one" on a second data pit pattern 319, a second transparent spacer layer 322, and a highly reflective thin film layer or coating 324 or layer "two" on a third pit pattern 323. An optical laser 330 emits an optical beam toward medium 312, as shown in FIG. 4. Light from the optical beam that is reflected by thin film layer 316, 320 or 324 is detected by detector 332, which senses modulation in light intensity based on the presence or absence of a pit in a particular spot on the thin film layers. The disc is unique in that any or all of the alloys presented below can be deposited upon the information pits and lands and used as the highly reflective thin film or coating 324 or the semi-reflective layer or coating 316 and 320. To playback the information on Layer 2, the light beam from laser diode 330 is going through the transparent polycarbonate substrate, passing through the first semi-reflective Layer 0, and the second semi-reflective Layer 1 and then reflected back from layer 2 to the detector 332. In another alternative (not shown), the disc may be varied by attaching two optical storage media 312 back-to-back, that is, with each transparent substrate 314 facing outward. The attachment method could be by UV cured adhesive, hot melt adhesive or other type of adhesives.

Figure 5:
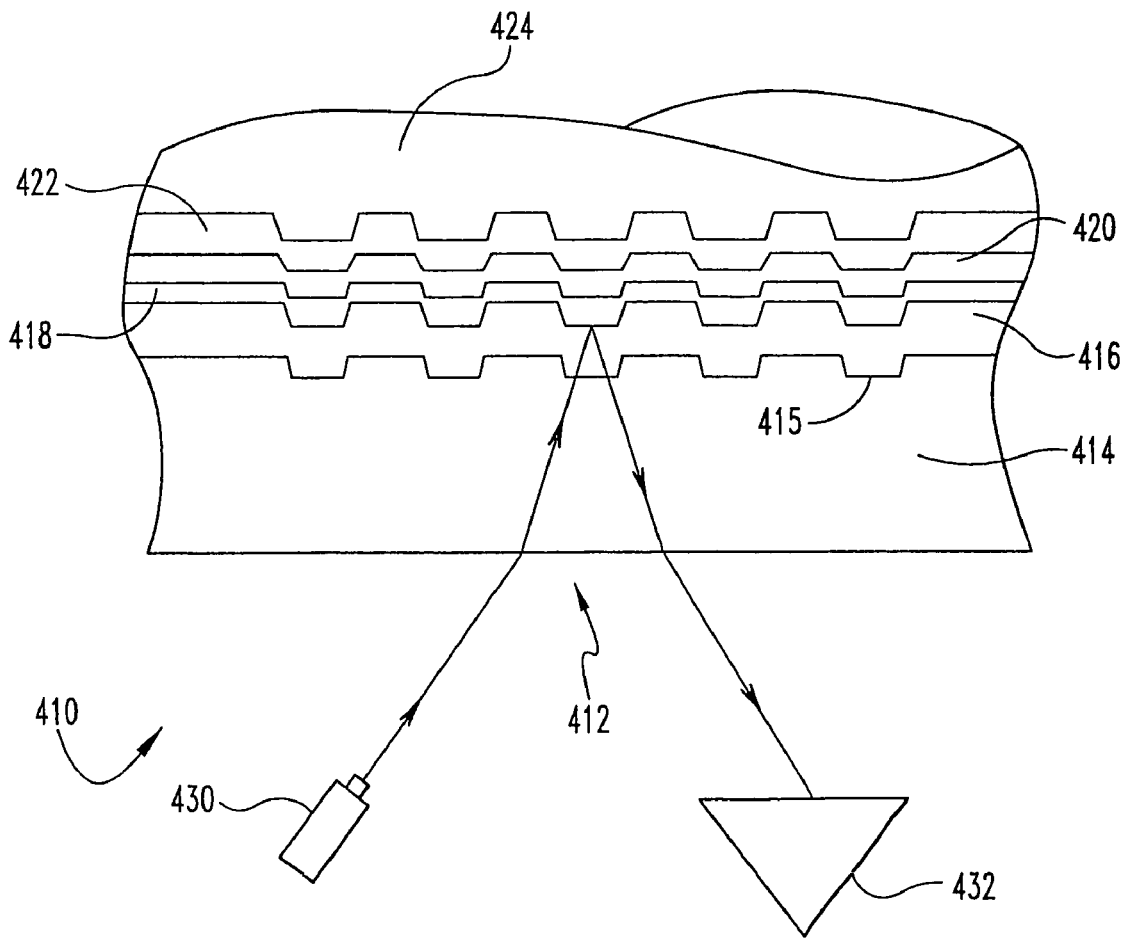
FIG. 5 is an optical storage system according to another embodiment, wherein the system contains a rewritable information layer.

Still another embodiment is shown in FIG. 5 as optical data storage system 410. Optical storage medium 412 comprises a transparent substrate or a transparent layer 414, a dielectric layer 416 on a first data pit pattern 415, a recording layer 418 made of a material having a microstructure including domains or portions capable of repeatedly undergoing laser-induced transitions from a first state to a second state and back again (i.e., an optically re-recordable or rewritable layer), such as a phase change material or a magneto-optic material, another dielectric material 420, a highly reflective thin film layer 422, and a transparent substrate or layer 424. As used in this specification, a dielectric material is a material that is an electrical insulator or in which an electric field can be sustained with a minimum dissipation of power. The different layers 414, 416, 418, 420 and 422 of the optical storage medium 410 are preferably oriented so as to be adjacent with one another.

Commonly used phase change materials for the recording layer 418 include germanium-antimony-tellurium (Ge—Sb—Te), silver-indium-antimony-tellurium (Ag—In—Sb—Te), chromium-germanium-antimony-tellurium (Cr—Ge—Sb—Te) and the like. Commonly used materials for the dielectric Layer 416 or 420 include zinc sulfide-silica compound (ZnS.SiO$_2$), silicon nitride (SiN), aluminum nitride (AlN) and the like. Commonly used magneto-optic materials for the recording layer 418 include terbium-iron-cobalt (Tb—Fe—Co) or gadolinium-terbium-iron (Gd—Tb—Fe). An optical laser 430 emits an optical beam toward medium 412, as shown in FIG. 5. In the recording mode for the phase change recordable optical medium, light from the optical beam is modulated or turned on and off according to the input digital data and focused on the recording layer 418 with suitable objective while the medium is rotated in a suitable speed to effect micro-structural or phase change in the recording layer. In the playback mode, the light from the optical beam that is reflected by the thin film layer 422 through the medium 412 is sensed by the detector 432, which senses modulations in light intensity based on the crystalline or amorphous state of a particular spot in the recording layers. The disc is unique in that one of the alloys presented below is deposited upon the medium and used as the highly reflective thin film 422. In another alternative (not shown), the disc may be varied by attaching two optical storage media 412 back-to-back, that is, with each transparent substrate or coating 414 facing outward. The attachment method could be by UV cured adhesive, hot melt adhesive or other type of adhesives.

As shown in FIG. 5, if the thickness of the transparent substrate 414 is about 1.2 mm thick made of injection molded polycarbonate with continuous spirals of grooves and lands, 424 is a UV cured acrylic resin 3 to 15 micron in thickness acting as a protective layer with the playback laser 430 at 780 to 820 nanometer, and the rewritable layer 418 is a phase change material of a typical composition such as Ag—In—Sb—Te, it is a structure of a compact disc-rewritable disc, or commonly known as CD-RW. To record and read information, phase change discs utilize the recording layer's ability to change from an amorphous phase with low reflectivity (dark) to a crystalline phase with high reflectivity (bright). Before recording, the phase change layer is in a crystalline state. During recording, a laser beam with high power focused on the recording layer will heat the phase change material to high temperature and when the laser is turned off, the heated spot cools off very fast to create an amorphous state. Thus a series of dark spots of amorphous states are created according to the input data of turning the focused laser beam on and off. These on and off correspond to "0" and "1" of a digital data stream.

In reading, a low laser power is used to focus on and read the dark or bright spots along the track of the disc to play back the recorded information. To erase, an intermediate laser power is used to focus on the grooves or tracks with the disc spinning so that an intermediate temperature of the focused spots is reached. After the laser spots are moved to another location, the spots cool to room temperature with a crystalline structure of high reflectivity. This returns the recording layer to its original or erased state. The change of the spots from amorphous to crystalline state is very reversible, thus many record and erase cycles can be accomplished and different data can be repeatedly recorded and read back with no difficulty.

If the thickness of the transparent substrate 414 is about 0.5 to 0.6 mm thick made of injection molded polycarbonate with continuous spirals of grooves and lands, with 416 and 420 being the dielectric layers made of typically ZnS.SiO$_2$, and 418 is made of a phase change material such as Ag—In—Sb—Te or Ge—Sb—Te, with 422 made of a silver alloy disclosed herein, and 424 is a UV cured resin bonding another half of the same structure as depicted in FIG. 5, with the read and write laser 430 at 630 to 650 nanometer wavelength, then it is a digital versatile disc with rewritable capability or commonly referred to as DVD+RW. Some preferred phase-changeable materials include materials from the following series: As—Te—Ge, As—In—Sb—Te, Te—Ge—Sn, Te—Ge—Sn—O, Te—Se, Sn—Te—Se, Te—Ge—Sn—Au, Ge—Sb—Te, Sb—Te—Se, In—Se—Tl, In—Sb, In—Sb—Se, In—Se—Tl—Co, Cr—Ge—Sb—Te and Si—Te—Sn, where As is arsenic, Te is tellurium, Ge is germanium, Sn is tin, O is oxygen, Se is selenium, Au is gold, Sb is antimony, In is indium, Tl is thallium, Co is cobalt, and Cr is chromium. In this disc configuration, the highly reflective layer 422 needs not only high reflectivity at 650 nanometer wavelength and high thermal conductivity, but also high corrosion resistance against ZnS.SiO$_2$ Conventional aluminum alloy do not have high enough reflectivity nor high enough thermal conductivity. Pure silver or other conventional silver alloys do not have either high corrosion resistance or high reflectivity and high thermal conductivity. Thus it is another embodiment to provide a series of silver alloys that can meet the requirements for this application.

Figure 6:
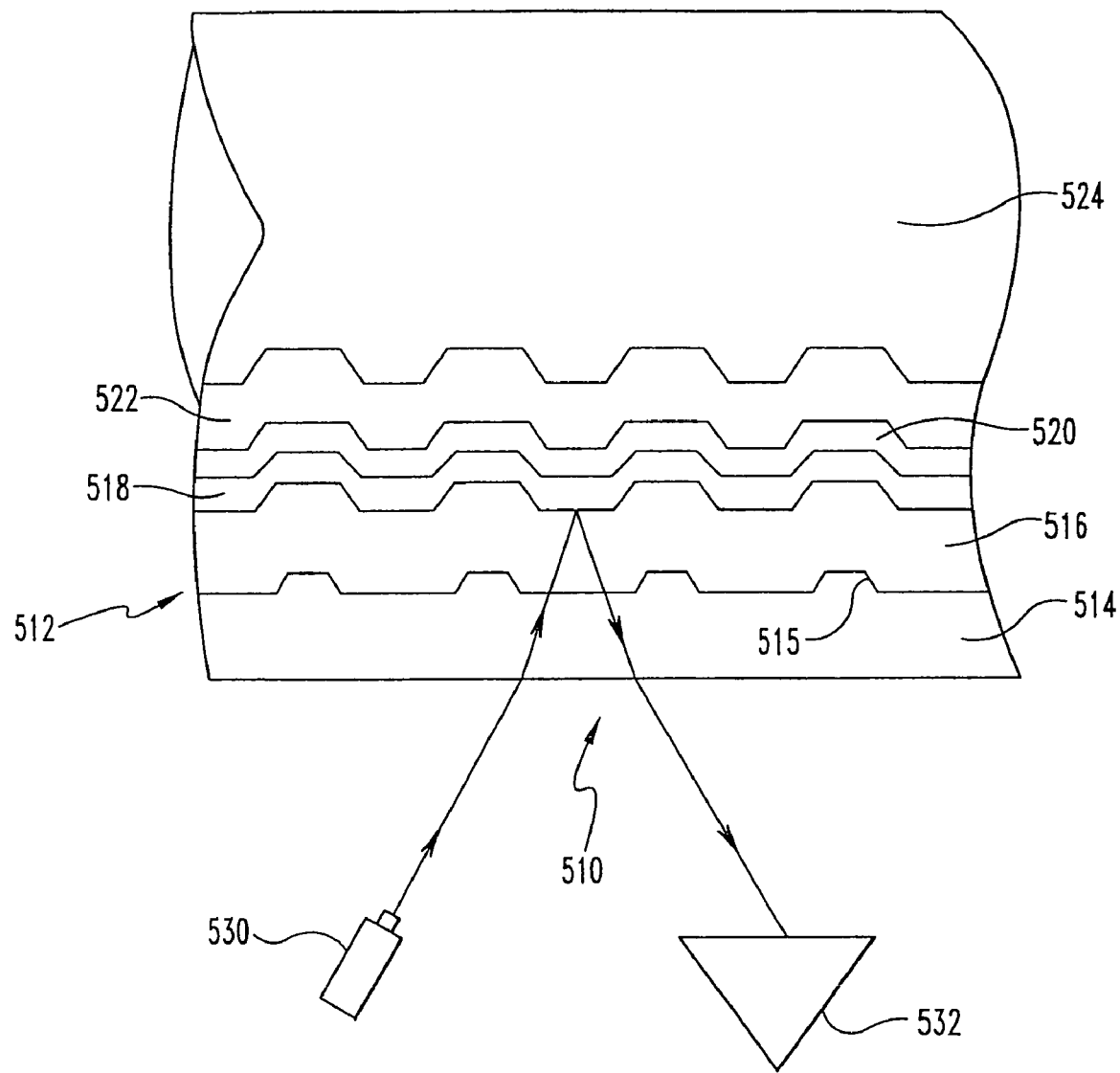
FIG. 6 is an optical storage system according to another embodiment, wherein the system contains a rewritable information layer.

Another embodiment is shown in FIG. 6 as an optical information storage system 510 of the rewritable type. Transparent cover layer 514 is approximately 0.1 mm in thickness. Dielectric layers 516 and 520 are preferably made of ZnS.SiO$_2$ and serve as a protective layer for the rewritable layer or phase change layer 518. Rewritable layer 518 is preferably formed from Ag—In—Sb—Te or the like. Highly reflective layer 522 is preferably formed from a silver alloy, such as disclosed herein. Transparent substrate 524 is preferably approximately 1.1 mm in thickness with continuous spiral tracks of grooves and land usually made with polycarbonate resin. Laser 530 preferably has a wavelength of about 400 nm with associated optics to focus the laser beam on to the recording layer 518. The reflected laser beam is received by the detector 532, which preferably includes associated data processing capability to read back the recorded information. This system 510 is sometimes called a "Digital Video Recording System" or DVR designed to record high definition TV signal. The principle of operation of this optical information storage system 510 is about the same as a CD-RW disc except the recording density is considerably higher and the storage capacity of a 5-inch diameter disc is approximately 20 gigabytes. Again the performance of the disc stack depends on a highly reflective, layer 522 at 400 nm wavelength with high corrosion resistance and very high thermal conductivity. Conventional reflective layer such as aluminum, gold or copper all have difficulty meeting this requirement. Thus it is another embodiment to provide a silver alloy reflective layer that is capable of meeting these demanding requirements.

Other optical recording media which can be used to practice this invention include for example optical storage devices readable and in some embodiments also rewritable from both sides of the device.

Figure 7:
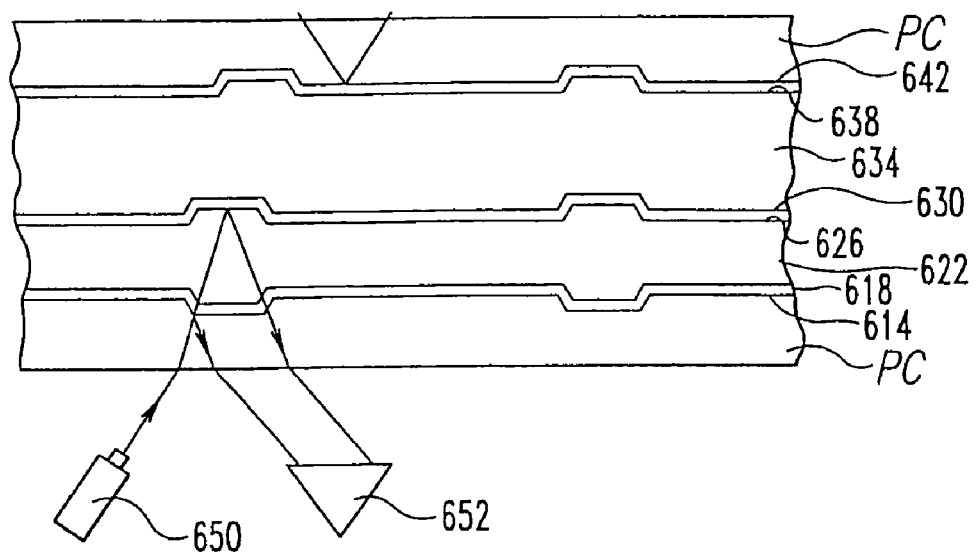
FIG. 7 is an optical storage system according to another embodiment for example a DVD-14.

One embodiment is illustrated in FIG. 7 optical data storage system 610. Optical storage system 610 is sometimes referred to as DVD-14 and is illustrative of devices that have the capacity to store accessible data on both sides of the structure.

Optical storage system 610 comprises a 0.6 mm thick transparent polycarbonate substrate (PC), adjacent to the PC layer or a part of the PC layer is a first data pit pattern 614 comprising a series of pits and lands. Adjacent to layer 614 and conforming to the contour of layer 614 is a semi-reflective layer or coating 618. Adjacent to the layer or coating 618 is a spacer 622 comprised of a transparent material adjacent to or a part of spacer layer 622 is a second data pit pattern 626 comprising a series of pits and lands. Adjacent to and conforming to the contour of second data pit pattern 626 is a reflective layer or coating 630. Both semi-reflective layer or coating 618 and highly reflective layers 630 can be read from the same side of structure 610.

Adjacent to layer or coating 634 is a second reflective layer or coating 638. Layer or coating 638 is adjacent to and conforms to the contours of a third data pit pattern 642 comprising a series of pits and lands. Third data pit pattern 642 and highly reflective layer or coating 638 are readable from the side of the device opposite to the side of the device from which data pit patterns 618, 626 are read. Adjacent to or comprising data pit pattern 642 is a second 0.6 mm thick polycarbonate layer.

An optical laser 660 emits an optical beam towards second polycarbonate layer PC, the beam is reflected by highly reflective layer or coating 638 and sensed by detector 662 modulations in light intensity based on the presence or absence of a pit in a particular spot on the highly reflective coating or layer.

As illustrated in FIG. 7, from the side of device 610 opposite of laser 660, a second optical beam from laser 650 is directed towards first polycarbonate substrate layer PC towards data pit pattern 614. As illustrated in FIG. 7, the second laser 650 emits an optical beam towards semi-reflective layer or coating 618 and highly reflective layer 630. At least a portion of the optical beam emitted by laser 650 passes through semi-reflective layer 618 to reach reflective layer 626. Light from the optical beam that is reflected by layer or coating 626 is sensed by detector 652, which senses modulations in light intensity based on the presence or absence of a pit or land in a particular spot on the highly reflective layer.

While the optical storage device illustrated in FIG. 7 comprises multiple laser sources 650, 660 and multiple detectors 652, 662, the same could be accomplished using a single laser source and detector configured such that the same optical beam source and detector can be used to collect signals from all sets of information pits and lands comprising the device, for example set 618, 626, 642.

Figure 8:
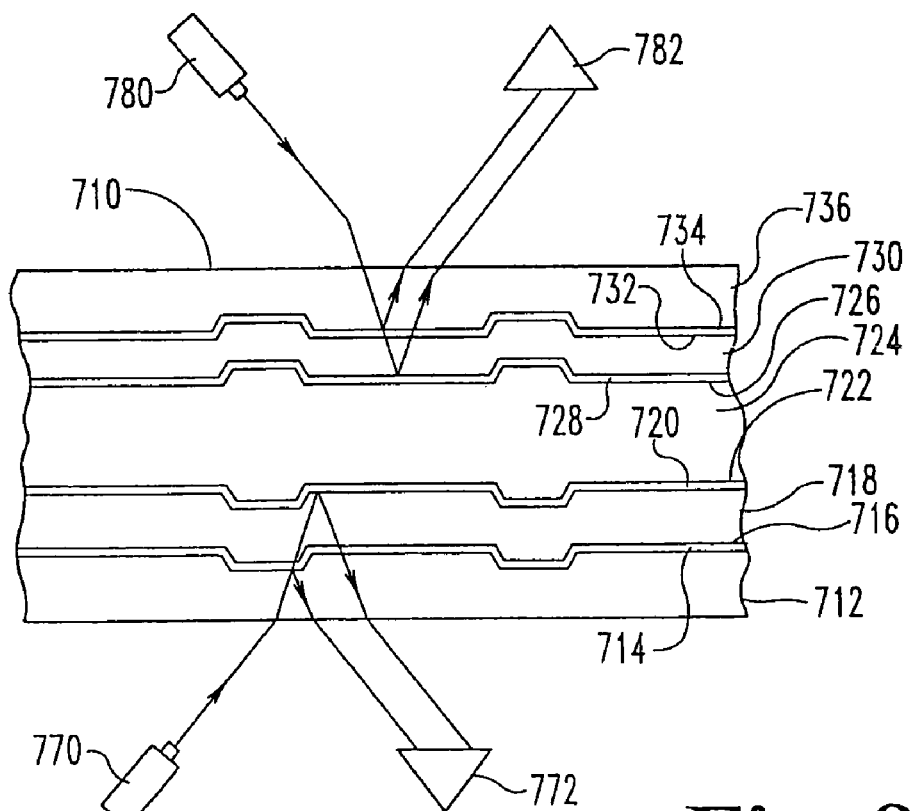
FIG. 8 is an optical storage system according to another embodiment for example a DVD-18.

Still another embodiment is the optical storage system 710 as illustrated in FIG. 8. Optical storage medium 710 is illustrative of a DVD-18 and is representative of optical storage systems that have multiple information layers readable from both sides of the optical storage medium.

Optical storage system 710 comprises a 0.6 mm thick transparent substrate 712 adjacent to, or comprising a first data pit pattern 714. Data pit pattern 714 comprises a series of pits and lands and is adjacent to a semi-reflective layer or coating 716. The device further includes a transparent spacer layer 718 about 50 microns thick, and a second data pit pattern 720 adjacent to a highly reflective film or coating 722. Both semi-reflective layer or coating 716 and highly reflective layer or coating 722 can be read from the same side of 710.

An optical laser 770 emits an optical beam towards transparent layer 712. As illustrated in FIG. 7 at least a portion of the optical beam emitted by laser source 770 passes through semi-reflective layer 716 to reach highly reflective layer 722. Light from the optical beam that is reflected by semi-reflective layer or coating 716 and highly reflective layer 722 is sensed by detector 772, which senses modulations in light intensity based on the presence or absence of a pit or land in a particular spot on the highly reflective layer or the semi-reflective layer.

The optical storage device illustrated in FIG. 8 further includes the spacer layer 724, which connects the portion of the device comprising the first two information layers 714, 720 with the portion of the device comprising the third and fourth information layers 728, 734. Substrate layer 724 is adjacent to and separates highly reflective layer or coating 728 and highly reflective layer or coating 722.

Highly reflective layer or coating 724 is adjacent to, and conforms to the contours of the pit and lands or data pit pattern layer 728. Layer 728 is adjacent to spacer layer 726, spacer layer 726 is adjacent to semi-reflective layer 732, which is adjacent to, and conforms to the contours of data pit pattern layer 734. Data pit pattern layer 734 is contiguous with, or adjacent to, 0.6 mm thick substrate layer 736.

In the embodiment illustrated in FIG. 8 an optional second optical laser 780 is provided which emits an optical beam towards layer 736. A portion of the light emitted by laser 780 passes through semi-reflective layer or coating 732 and is reflected by highly reflective layer or coating 724 light reflected by semi-reflective layer or coating 732 and highly reflective layer 724 is sensed by detector 782, which senses modulations in light intensity based on the presence or absence of a pit or land in a particular spot on the highly reflective layer.

While the optical storage device illustrated in FIG. 8 includes multiple laser sources 770, 780 and multiple detectors 752, 772, the same could be accomplished using a single laser source and detector configured such that the same optical beam source and detector can be used to collect signals from all sets of information pits and lands comprising the device.

Yet another embodiment includes the proposed next generation optical storage device sometimes referred to as "Blu-ray." Blu-ray devices incorporate lasers, which operate at a wavelength of 405 nm and lenses, with a numerical aperture of 0.85.

Figure 9:
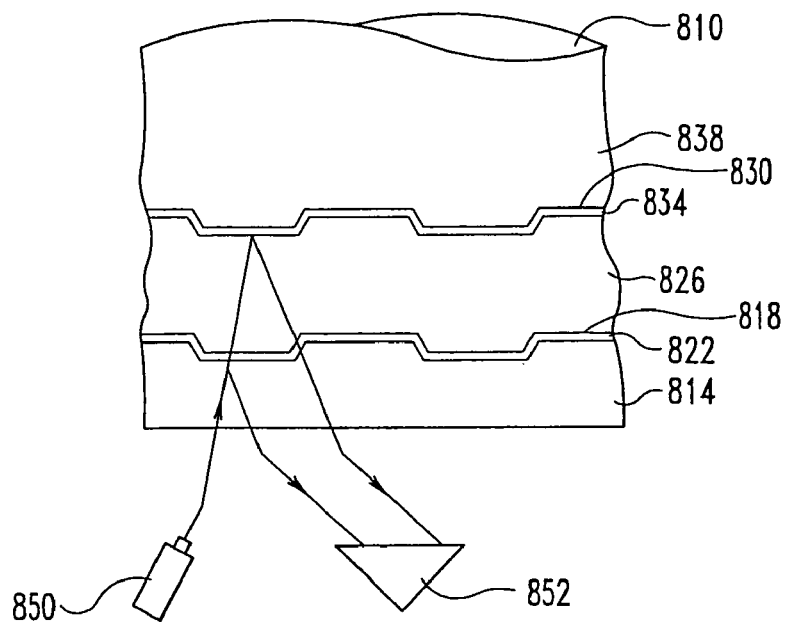
FIG. 9 is an optical storage system according to another embodiment, an optical storage system of the Blu-ray type with layers suitable for high density digital information storage readable from one side.

As illustrated in FIG. 9 optical storage system 810 of the prerecorded type of "Blu-Ray" disc comprises two sets of information pits and lands 818 and 830 readable from the same side of the device. Device 810 comprises transparent cover layer 814 about 0.1 mm in thickness, and a substrate layer 838 about 1.1 mm thickness with an adjacent highly reflective layer or coating 834. Highly reflective layer or coating 834 is adjacent to, and conforms to the second data pit pattern 830 injection molded onto the substrate 838. Data pit pattern 830 comprising a set of pits and lands is adjacent to, or a part of, substrate 838. Layer 826 is adjacent to the semi-reflective layer 822. Semi-reflective layer or coating 822 is adjacent and conforms to first data pit pattern 818 comprising a set of pits and lands. Data pit 818 is adjacent to or a part of the transparent cover layer 814.

As illustrated in FIG. 9, an optical beam source laser 850 is provided, as is detector 852. Optical laser 850 emits an optical beam towards layer 814 through an objective lens (not shown in FIG. 9). A portion of the light emitted by laser 850 passes through a lens (not shown), the semi-reflective layer, or coating, 822 and is reflected by highly reflective layer, or coating, 834 and sensed by detector 852, which senses modulations in light intensity based on the presence or absence of a pit or land in a particular spot on the highly reflective layer or coating 822.

A portion of the optical beam emitted by optical laser 850 is partially reflected by semi-reflective layer or coating 822 is sensed by detector 852, which senses modulations in light intensity based on the presence or absence of a pit or land in a particular spot on semi-reflective layer or coating 822.

Figure 10:
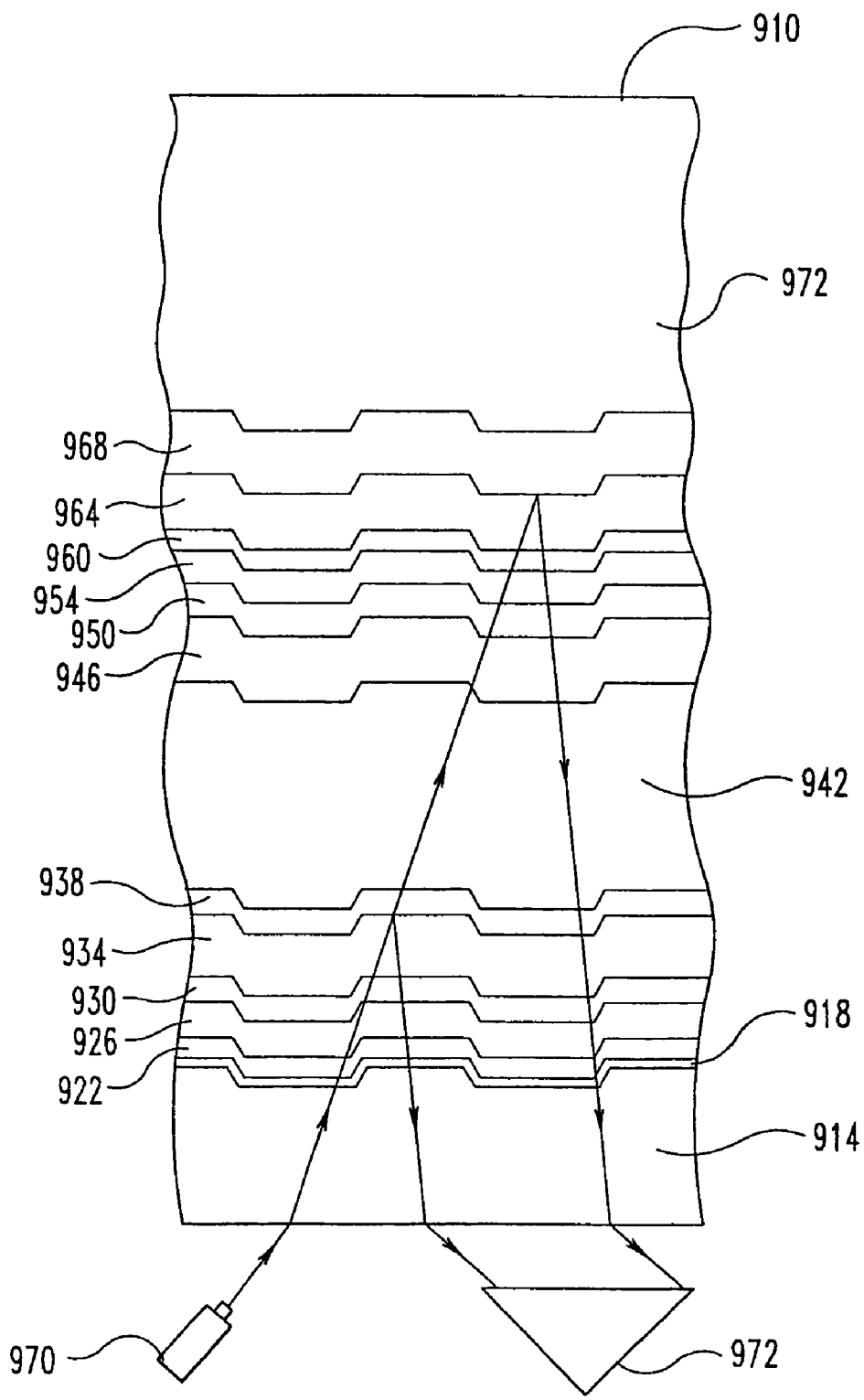
FIG. 10 is an optical storage system according to another embodiment, an optical storage system of the Blu-ray type including two re-writable high density digital information storage layers readable and re-recordable from one side.

In one embodiment, as illustrated in FIG. 10, an optical storage device 910 of the Blu-ray rewritable type further comprises two read and rewritable layers 926, 954. Optical storage device 910 comprises a substrate layer 972 about 1.1 mm thick, adjacent to highly reflective layer or coating 968. Adjacent to layer or coating 968 is a first dielectric layer 964 comprising ZnS—SiO$_2$, adjacent to layer 964 is a first interface layer 960 such as Ge—N or others. Adjacent to layer 960 is a phase-change type recording layer such as Ge—Sb—Te 954 and the like with thickness about 10 to 15 nm, adjacent to layer 954 is layer 950 a second layer such as Ge—N and the like. Adjacent to layer 950 is layer 946 a second dielectric layer of ZnS—SiO$_2$.

Optical storage device 910 further includes an intermediate layer 942 sandwiched between the dielectric layer 946 approximately 20 to 40 microns thick and a semi-reflective layer or coating 938 about 10 nm thick. A third dielectric layer 934 comprised of ZnS—SiO$_2$ is adjacent to layer or coating 938. Adjacent to layer 934 is a third interface layer 930 made with Ge—N or others, a recording layer 926 6-10 nm thick comprised of Ge—Sn—Sb—Te or other phase-change material is sandwiched between layers 930 and a fourth interface layer 922 made of Ge—N and the like. Adjacent to layer 922 is a fourth layer of dielectric material layer 918 comprised of ZnS—SiO$_2$. Adjacent to layer 918 is a transparent cover layer 914 about 80 to 100 microns thick.

As illustrated in FIG. 10 an optical beam emitted by laser 970 passes through layers 914, 918, 922, 926, 930, 934 and is reflected by layer 938 and sensed by detector 972. A portion of an optical beam emitted by laser 970 passes through layers 914, 918, 922, 926, 930, 934, 938, 942, 946, 950, 954, 960, 964, and is reflected by layer 968 to and sensed by detector 972. All the silver alloy compositions disclosed can be used for the semi-reflective layer 938 or the highly reflective layer 968. In the recording mode, the laser beam from laser 970 will be focused on the phase-change layer 926 or 954 to change its reflectivity properties similar to a conventional CD-RW, DVD-RW, DVD+RW or next generation of optical discs with playback laser wavelength at around 400 nm as disclosed in prior art such as U.S. Pat. Nos. 6,544,616, 6,652,948, 6,649,241 and others which are hereby incorporated by reference in their entirety.

Figure 11:
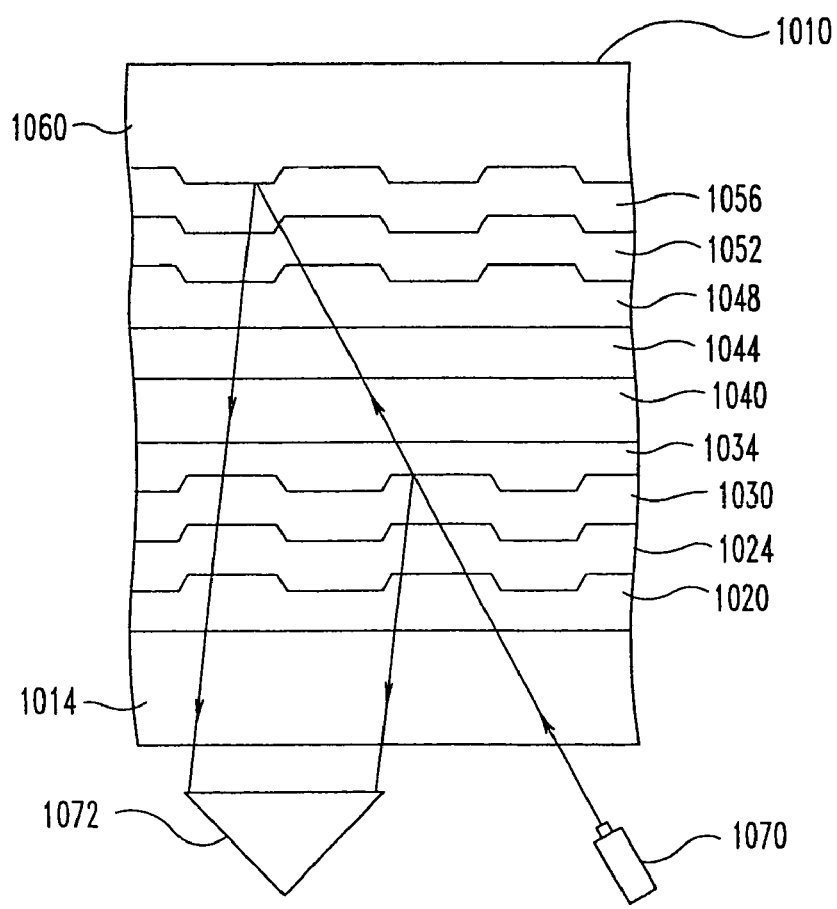
FIG. 11 is an optical storage system according to another embodiment, an optical storage system of the Advanced Optical Disc (AOD) type including two high density digital information storage layers readable from one side.

It is understood that the disc structure as described in FIG. 11 can be modified that both 1014 and 1060 can be of approximately of the same thickness or around 0.6 mm and with similar phase-change material recording stack, the disc structure could be a rewritable optical disc of the "Advanced Optical Disc" or AOD type wherein the recording and playback laser wavelength is around 400 nm.

It is further understood that all the optical disc structures as described in FIG. 7, 8, 9, 12 contain a dual layer disc structure of the prerecorded type wherein the playback laser beam has a wavelength of around 635 to 650 nm as in FIGS. 7 and 8, or contain a dual layer HD-DVD disc structure wherein the playback laser has a wavelength around 400 nm or any other optical disc structure with two or more layers of information all recorded or played back from one side of the disc in which a semi-reflective layer or layers of silver alloy as disclosed in this invention is made useful.

One embodiment, as illustrated in FIG. 11 is an optical storage device 1010 of the 'Blu-ray' configuration, further comprising two write once layers 1048 and 1024. Optical storage device 1010 is a dual-layer write once recording medium comprised of 1.1 mm thick substrate layer 1060, adjacent to a highly reflective layer 1056 about 30 to 60 nm thick usually made with silver alloy of the current invention or an aluminum alloy. Layer 1056 is adjacent to protective layer 1052, layer 1052 is adjacent to a recordable layer 1048, 15 to 25 nm thick comprised of Te—O—Pd based material or others. Layer 1048 is adjacent to protective film layer 1044.

Layer 1044 is adjacent to a separation layer or spacer layer 1040 which is adjacent to a 10 nm thick semi-reflective layer or coating 1034 made with silver alloy of the current invention. Layer or coating 1034 is adjacent to protective film layer 1030 which is adjacent to a second 10 nm thick recording layer 1024 comprising Te—O—Pd based material or others. Layer 1024 is adjacent to protective film 1020 which is adjacent to a 0.075 mm thick cover layer 1014.

As illustrated in FIG. 11, an optical beam emitted by laser 1070 passes a lens system with NA 0.85 (not shown) in FIG. 11 through layers 1014, 1020, 1024, 1030 and is reflected by the semi-reflective layer 1034 and sensed by detector 1072. A portion of an optical beam emitted by laser 1070 passes through layers 1014, 1020, 1024, 1030, 1034, 1040, 1044, 1048, 1052, and is reflected by highly reflective layer 1056 and sensed by detector 1072. Detector 1072 senses modulations in light intensity based on the amorphous or the crystalline state of the layer 1024 or 1048 in a particular spot on semi-reflective layer or coating 1034 and on the highly reflective layer 1056 and reads the stored information back by focusing laser light from 1070 laser on the write-once layer 1024 or 1048. The spacer layer 1040 should be thick enough so that when the read beam is focused on the recordable layer 1024, the read beam is sufficiently defocused on the next recordable layer 1048 and only the modulation of light information from 1024 is reflected back to the detector 1072. Conversely, when the read beam is focused on the recordable layer 1048, the read beam is sufficiently defocused on the other recording layer 1024 and only the modulation from 1048 is reflected to the detector 1072 and read.

It is also understood that as described in FIGS. 10 and 11, a dual layer disc of the write-once or a rewritable type with a phase change recording layer or other types of recording layers can be constructed such that at least two recording layers can be recorded and read from one side or the same side of the disc wherein a semi-reflective layer made with silver alloy of the current invention can be utilized and made useful.

Figure 12:
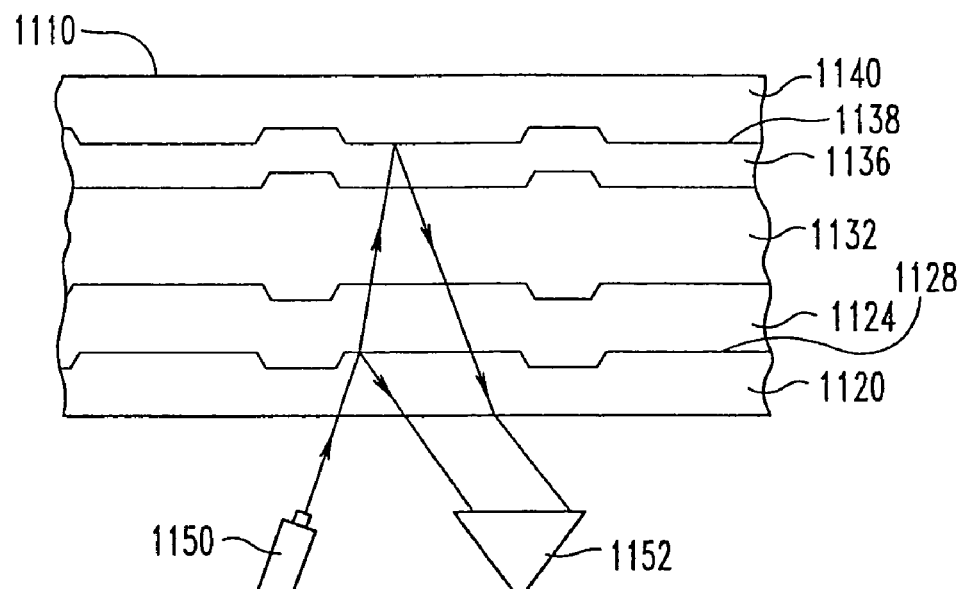
FIG. 12 is an optical storage system according to another embodiment, an optical storage system of the Advanced Optical Disc (AOD) type including two re-writable high density digital information storage layers readable and re-recordable from one side.

Another embodiment, as illustrated in FIG. 12, is optical storage device 1110 of a prerecorded type, which is the proposed next generation optical storage device sometimes referred to as an Advanced Optical Device (AOD). AOD is a system that uses a 405 nm wavelength laser beam and a lens system with a NA of 0.65 to record and retrieve information for both faces of an optical storage device wherein the transparent substrates 1120 and 1140 made typically with injection molded polycarbonate are approximately 0.6 mm thick.

Device 1110 comprises a transparent substrate layer 1140 adjacent to a highly-reflective layer or coating 1136 which is adjacent to and conforms to the contours of a first data pit pattern 1138 comprising a set of pits and lands. High reflectivity layer 1136 is adjacent to spacer layer 1132 which is adjacent to a semi-reflective layer or coating 1124 of the current invention which is adjacent to and conforms to the contours of a second data pit pattern 1128 comprising a series of pits and lands. Layer 1124 is adjacent to a second substrate or layer 1120.

As illustrated in FIG. 12, a portion of an optical beam emitted by laser 1150 passes through layers 1120, 1124, 1128, 1132, and is reflected by the highly reflective layer 1136 and sensed by detector 1152. A portion of an optical beam emitted by laser 1150 passes through layers 1120, and is reflected by semi-reflective layer or coating 1124 and sensed by detector 1152. Detector 1152 senses modulations in light intensity based on the presence or absence of a pit or land in a particular spot on semi-reflective layer or coating 1124 and the highly reflective layer or coating 1136 by focusing on layer 1124 or 1136.

Figure 13:
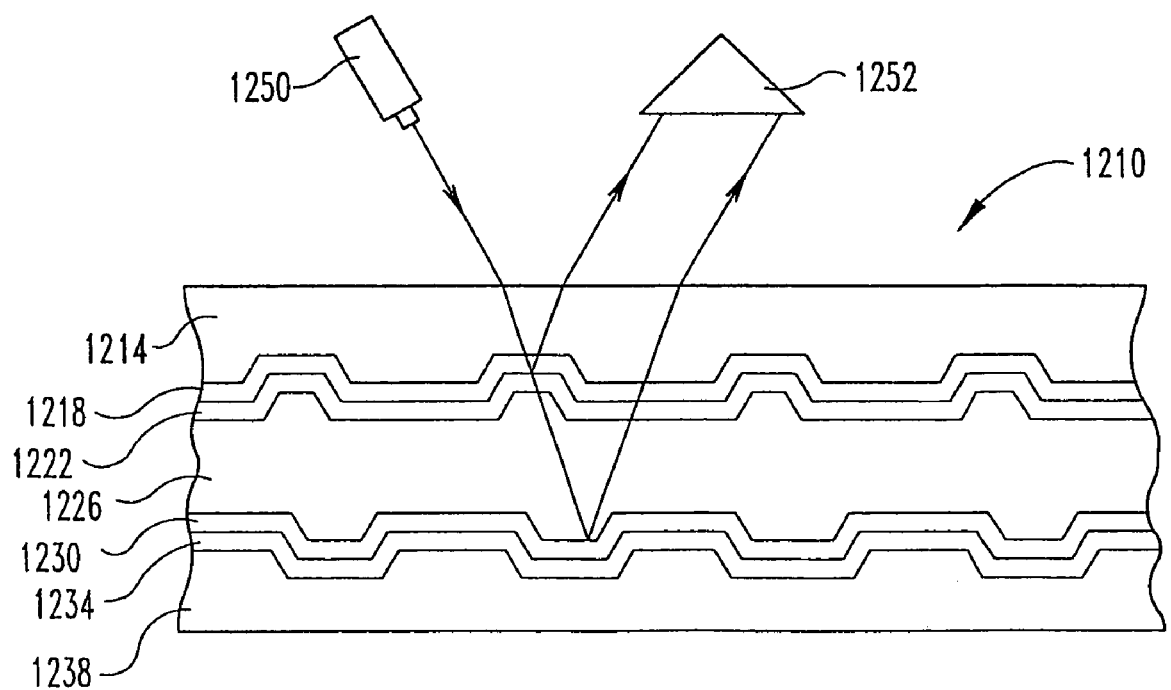
FIG. 13 is an optical storage system according to still another embodiment, which includes two readable and recordable layers readable and recordable from one side.

In another embodiment, illustrated in FIG. 13 an optical storage device 1210 of the organic dye recordable-dual-layer type comprises two layers which are both readable and recordable from the same side of the device. Device 1210 comprises a transparent substrate layer 1214 adjacent to first recordable dye layer 1218. Dye layer 1218 is adjacent to semi-reflective layer or coating 1222 of the current invention. Layer or coating 1222, sometimes called "Layer zero" or L0, is adjacent to spacer layer 1226. Spacer layer 1226 is adjacent to a second dye recording layer 1230. Layer 1230 is adjacent to highly reflective layer or coating 1234. Reflective layer or coating 1234, sometimes called "layer one" or L1, is adjacent to polycarbonate substrate or layer 1238.

In write mode, as illustrated in FIG. 13, optical beam source 1250 emits a laser beam which passes through layers 1214, and is focused on dye layer 1218. When laser 1250 is operating at high intensity the optical beam focused on layer 1218 decomposes the dye in layer 1218 creating a data pit pattern comprising the equivalent of a series of pits and lands. A portion of an optical beam emitted by laser 1250 passes through layers 1214, 1218, 1222, 1226 and is focused on dye layer 1230. When laser 1250 is operating at high intensity, the optical beam focused on layer 1230 decomposes the dye in layer 1230 to create a data pit pattern comprising a series of pits and lands.

In read mode a portion of an optical beam emitted by laser 1250 passes through transparent polycarbonate layer 1214 and dye layer 1218, is reflected by the semi-reflective layer or coating 1222 and sensed by detector 1252. A portion of the optical beam also passes through layers 1214, 1218, 1222, 1226, 1230 and is reflected by highly reflective layer 1234 and sensed by detector 1252. Detector 1252 senses modulations in light intensity based on the presence or absence of a pit or land in a particular spot on the reflective layer or coating 1234 or by the semi-reflective layer or coating 1222 depending on whether the laser light 1250 is focused on the semi-reflective layer 1222 or the highly reflective layer 1234. For the general operation of an organic dye-based optical recording medium, the reader can refer to U.S. Pat. Nos. 6,641,889, 6,551,682, etc.

It is further understood that the optical disc structure as described in FIG. 13 can be a dual layer DVD-R or DVD+R disc wherein the playback laser beam has a wavelength of around 635 to 650 nm, or the structure can be a dual layer HD-DVD-R disc wherein the playback laser has a wavelength around 400 nm or any other optical disc structure wherein two or more layers of information can all be recorded or played back from one side of the disc in which a semi-reflective layer or layers of silver alloy as disclosed in this invention is made useful.

As used herein, the term "reflectivity" refers to the fraction of optical power incident upon transparent substrate 14, 114, 214, 314, 414 or 514 which, when focused to a spot on a region of layer 20, 120, 216, 220, 316, 320, 324, 422 or 522 could in principle, be sensed by a photodetector in an optical readout device. It is assumed that the readout device includes a laser, an appropriately designed optical path, and a photodetector, or the functional equivalents thereof.

This invention is based on the observation that particular silver-based alloys provide sufficient reflectivity and corrosion resistance to be used as the highly reflective or the semi-reflective layer in an optical storage medium, without the inherent cost of a gold-based alloy or the process complication of a silicon-based material. In one embodiment, the silver is alloyed with a comparatively small amount of zinc. In this embodiment, the relationship between the amounts of zinc and silver ranges from about 0.01 a/o percent (atomic percent) to about 15 a/o percent zinc and from about 85 a/o percent to about 99.99 a/o percent silver. But preferably in respect to each metal, the alloy has from about 0.1 a/o percent to about 10.0 a/o percent zinc and from about 90.0 a/o percent to about 99.9 a/o percent silver.

In another embodiment, the silver is alloyed with a comparatively small amount of aluminum. In this embodiment, the relationship between the amounts of aluminum and silver ranges from about 0.01 a/o percent (atomic percent) to about 5 a/o percent aluminum and from about 95 a/o percent to about 99.99 a/o percent silver. But preferably in respect to each metal, the alloy has from about 0.1 a/o percent to about 3.0 a/o percent aluminum and from about 97 a/o percent to about 99.9 a/o percent silver.

In another embodiment, the silver-based, binary alloy systems as mentioned above are further alloyed with cadmium (Cd), lithium (Li), or manganese (Mn). If one or more of these metals replaces a portion of the silver in the alloy, the corrosion resistance of the resultant thin film will likely increase; however, the reflectivity will also likely drop. The amount of cadmium, lithium, or manganese that may favorably replace some of the silver in the binary alloy ranges from about 0.01 a/o percent to about 20 a/o percent of the amount of silver present for cadmium, from about 0.01 a/o percent to about 10 a/o percent or even to about 15 a/o percent of the amount of silver present for lithium, and from about 0.01 a/o percent to about 7.5 a/o percent of the amount of silver present for manganese.

In still another embodiment, the silver-based, zinc and aluminum binary alloy systems as mentioned above are further alloyed with a precious metal such as gold (Au), rhodium (Rh), copper (Cu), ruthenium (Ru), osmium (Os), iridium (Ir), platinum (Pt), palladium (Pd), and mixtures thereof, which may be added to the above binary alloys with the preferable range of precious metal to be about 0.01 a/o to 5.0 a/o percent of the amount of silver present. In addition to the precious metals, the above alloys may be still further alloyed with a metal such as titanium (Ti), nickel (Ni), indium (In), chromium (Cr), germanium (Ge), tin (Sn), antimony (Sb), gallium (Ga), silicon (Si), boron (B), zirconium (Zr), molybdenum (Mo), and mixtures thereof. In relation to the amount of silver that is present in the above silver alloy system, the amount of these metals that may be preferably added ranges from about 0.01 a/o percent to about 5.0 a/o of the amount of silver present.

In still another embodiment, the silver is alloyed with a comparatively small amount of both zinc and aluminum. In this embodiment, the relationship between the amounts of zinc, aluminum and silver ranges from about 0.1 a/o percent to about 15 a/o percent zinc, from about 0.1 a/o percent to about 5 a/o percent aluminum, and from about 80 a/o percent to about 99.8 a/o percent silver. But preferably in respect to each metal, the alloy has from about 0.1 a/o percent to about 5.0 a/o percent zinc, from about 0.1 a/o percent to about 3.0 a/o percent aluminum, and from about 92.0 a/o percent to about 99.8 a/o percent silver.

In yet another embodiment, the silver-based zinc-aluminum ternary alloy system as mentioned above is further alloyed with a fourth metal. The fourth metal may include manganese or nickel. If one or a mixture of these metals replaces a portion of the silver in the alloy, the corrosion resistance of the resultant thin film will likely increase; however, the reflectivity will also likely drop. The amount of manganese or nickel that may favorably replace some of the silver in the above ternary alloy ranges from about 0.01 a/o percent to about 7.5 a/o percent of the amount of silver present for manganese, with a preferable range being between about 0.01 a/o percent and about 5.0 a/o percent of the amount of silver present. The amount of nickel may range from between about 0.01 a/o percent to about 5.0 a/o percent of the amount of silver present with a preferable range being between from about 0.01 a/o percent and about 3.0 a/o percent of the amount of silver present.

In still another embodiment, the silver-based zinc-aluminum ternary alloy system as mentioned above is further alloyed with a precious metal such as gold, rhodium, copper, ruthenium, osmium, iridium, platinum, palladium, and mixtures thereof, which may be added to the above ternary alloys with the preferable range of precious metal to be about 0.01 a/o to 5.0 a/o percent of the amount of silver present. In addition to the precious metals, the above alloys may also be alloyed with a metal such as titanium, nickel, indium, chromium, germanium, tin, antimony, gallium, silicon, boron, zirconium, molybdenum, and mixtures thereof. In relation to the amount of silver that is present in the above silver alloy system, the amount of such metals that may be preferably added ranges from about 0.01 a/o percent to about 5.0 a/o percent of the amount of silver present.

In another embodiment an optical storage medium comprises a first substrate having a pattern of features in at least one major surface and a first reflective layer adjacent the feature pattern. The reflective layer is made of a silver and zinc alloy where the relationship between the amount of silver and the amount of zinc is defined by $Ag_xZn_y$ where $0.85<x<0.9999$ and $0.0001<y<0.15$.

In another embodiment an optical storage medium comprises a first substrate having a pattern of features in at least one major surface and a first reflective layer adjacent the feature pattern. The reflective layer is made of a silver and aluminum alloy where the relationship between the amount of silver and the amount of aluminum is defined by $Ag_xAl_z$ where $0.95<x<0.9999$ and $0.0001<x<0.05$.

In another embodiment an optical storage medium comprises a first substrate having a pattern of features in at least one major surface and a first reflective layer adjacent the feature pattern. The reflective layer is made of a silver and zinc and aluminum alloy where the relationship between the amount of silver and the amount of zinc and the amount of aluminum is defined by $Ag_xZn_yAl_z$ where $0.80<x<0.998$ and $0.001<y<0.15$, and $0.001<z<0.05$.

In another embodiment an optical storage medium comprises a first substrate having a pattern of features in at least one major surface and a first reflective layer adjacent the feature pattern. The reflective layer is made of a silver and manganese alloy where the relationship between the amount of silver and manganese is defined by $Ag_xMn_t$ where $0.925<x<0.9999$ and $0.0001<t<0.075$.

In another embodiment an optical storage medium comprises a first substrate having a pattern of features in at least one major surface and a first reflective layer adjacent the feature pattern. The reflective layer is made of a silver and germanium alloy where the relationship between the amount of silver and the amount of germanium is defined by $Ag_xGe_q$ where $0.97<x<0.9999$ and $0.0001<q<0.03$.

In another embodiment an optical storage medium comprises a first substrate having a pattern of features in at least one major surface and a first reflective layer adjacent the feature pattern. The reflective layer is made of a silver and copper and manganese alloy where the relationship between the amount of silver and the amount of copper and the amount of manganese is defined by $Ag_xCu_pMn_t$ where $0.825<x<0.9998$ and $0.0001<p<0.10$, and $0.0001<t<0.075$.

In another embodiment, the silver is alloyed with a comparatively small amount of manganese. In this embodiment, the relationship between the amounts of manganese and silver ranges from about 0.01 a/o percent to about 7.5 a/o percent manganese and from about 92.5 a/o percent to about 99.99 a/o percent silver. But preferably in respect to each metal, the alloy has from about 0.1 a/o percent to about 5 a/o percent manganese and from about 95 a/o percent to about 99.9 a/o percent silver.

In yet another embodiment, the silver-based binary manganese alloy system as mentioned above is further alloyed with a third metal. The third metal may include cadmium, nickel, lithium and mixtures thereof. If one or a mixture of these metals replaces a portion of the silver in the alloy, the corrosion resistance of the resultant thin film will likely increase; however, the reflectivity will also likely drop. In relation to the amount of silver that is present in the above binary alloy systems, the amount of cadmium may be range from about 0.01 a/o percent to about 20 a/o percent of the alloy of the amount of silver present, the amount of nickel may range from between about 0.01 a/o percent to about 5.0 a/o percent of the amount of silver present, and the amount of lithium may range from about 0.01 a/o percent to about 10.0 a/o percent of the amount of silver present.

In still another embodiment, the silver-based manganese alloy system as mentioned above is further alloyed with a precious metal such as gold, rhodium, copper, ruthenium, osmium, iridium, platinum, palladium, and mixtures thereof, which may be added to the above binary alloys with the preferable range of precious metal to be about 0.01 a/o to 5.0 a/o percent of the amount of silver present. In addition to the precious metals, the above alloys may also be alloyed with a metal such as titanium, indium, chromium, germanium, tin, antimony, gallium, silicon, boron, zirconium, molybdenum, and mixtures thereof. In relation to the amount of silver that is present in the above silver alloy system, the amount of the latter metal(s) that may be preferably added ranges from about 0.01 a/o percent to about 5.0 a/o percent of the amount of silver present.

In still another embodiment, the silver is alloyed with a comparatively small amount of germanium. In this embodiment, the relationship between the amounts of germanium and silver ranges from about 0.01 a/o percent to about 3.0 a/o percent germanium and from about 97.0 a/o percent to about 99.99 a/o percent silver. But preferably in respect to each metal, the alloy has from about 0.1 a/o percent to about 1.5 a/o percent germanium and from about 98.5 a/o percent to about 99.9 a/o percent silver.

In yet another embodiment, the silver-based germanium alloy system as mentioned above is further alloyed with a third metal. The third metal may include manganese or aluminum. If one or a mixture of these metals replaces a portion of the silver in the alloy, the corrosion resistance of the resultant thin film will likely increase; however, the reflectivity will also likely drop. In relation to the amount of silver that is present in the above binary alloy system, the amount of manganese may be range from about 0.01 a/o percent to about 7.5 a/o percent of the amount of silver present and the amount of aluminum may range from between about 0.01 a/o percent to about 5.0 a/o percent of the amount of silver present.

In still another, the silver-based germanium alloy system as mentioned above is further alloyed with a precious metal such as gold, rhodium, copper, ruthenium, osmium, iridium, platinum, palladium, and mixtures thereof, which may be added to the above binary alloys with the preferable range of precious metal to be about 0.01 a/o to 5.0 a/o percent of the amount of silver present. In addition to the precious metals, the above alloys may also be alloyed with a metal such as zinc, cadmium, lithium, nickel, titanium, zirconium, indium, chromium, tin, antimony, gallium, silicon, boron, molybdenum, and mixtures thereof. In relation to the amount of silver that is present in the above silver alloy system, the amount of these metals that may be preferably added ranges from about 0.01 a/o percent to about 5.0 a/o percent of the amount of silver present.

In still another embodiment, the silver is alloyed with a comparatively small amount of both copper and manganese. In this embodiment, the relationship between the amounts of copper, manganese and silver ranges from about 0.01 a/o percent to about 10 a/o percent copper, from about 0.01 a/o percent to about 7.5 a/o percent manganese, and from about 82.5 a/o percent to about 99.98 a/o percent silver. But preferably in respect to each metal, the alloy comprises about 0.1 a/o percent to about 5.0 a/o percent copper, from about 0.1 a/o percent to about 3.0 a/o percent manganese, and from about 92.0 a/o percent to about 99.8 a/o percent silver.

In yet another embodiment, the silver-based copper-manganese alloy system as mentioned above is further alloyed a fourth metal. The fourth metal such as aluminum, titanium, zirconium, nickel, indium, chromium, germanium, tin, antimony, gallium, silicon, boron, molybdenum, and mixtures thereof. In relation to the amount of silver that is present in the above silver alloy system, the amount of the fourth metal that may be preferably added ranges from about 0.01 a/o percent to about 5.0 a/o percent of the amount of silver present.

The optical properties of these silver alloys as thin film in the thickness of 8 to 12 nanometers for the semi reflective layer of DVD-9 dual layer discs are illustrated in Table I in the following. As mentioned in U.S. Pat. No. 5,464,619 assigned to Matsushita Electric and U.S. Pat. No. 5,726,970 assigned to Sony that in a dual layer optical disc structure as indicated in FIG. 3 and in Table I, the relationship between the reflectivity of Layer "0" or 216 in FIG. 3 as $R_0$, the reflectivity of Layer "1" or 220 measured from outside the disc in FIG. 3 as $R_1$, and the transmission of Layer "0" as $T_0$ is $R_0 = R_1 T_0^2$ where $R_1$ is the reflectivity of Layer "1" itself. When the layer "0" thickness is optimized for balanced signal and reflectivity, and Layer "1" is an conventional aluminum alloy at 50 to 60 nanometers, the balanced reflectivity of various silver alloys is shown in Table I where R is the reflectivity of the thin film achievable at 60 nanometer or higher in thickness at 650 nanometer wavelength if used as the Layer "1" or the high reflectivity layer of DVD-9 or any other high reflectivity application of optical information storage medium. All compositions in the table are in atomic percent.

TABLE I

Balance of reflectivity of Layer 0 and Layer 1 of DVD-9 dual layer disc for various silver alloy Layer 0 and typical aluminum alloy Layer 1.

| Composition | $T_0$ | $R_0$ | $R_1'$ | R |
|---|---|---|---|---|
| Ag—13.0% Zn | 0.47 | 0.185 | 0.183 | 0.80 |
| Ag—6.0% Zn | 0.52 | 0.22 | 0.224 | 0.92 |
| Ag—4.0% Zn | 0.53 | 0.23 | 0.233 | 0.93 |
| Ag—10.3% Cd | 0.51 | 0.22 | 0.216 | 0.91 |
| Ag—14.5% Li | 0.53 | 0.23 | 0.232 | 0.93 |
| Ag—4.3% Al | 0.47 | 0.18 | 0.183 | 0.80 |
| Ag—1.5% Al | 0.53 | 0.23 | 0.234 | 0.93 |
| Ag—2.0% Ni | 0.54 | 0.241 | 0.241 | 0.94 |
| Ag—1.0% Ni | 0.545 | 0.247 | 0.246 | 0.95 |
| Ag—3.1% Mn | 0.51 | 0.216 | 0.214 | 0.91 |
| Ag—1.5% Mn | 0.54 | 0.243 | 0.242 | 0.94 |
| Ag—0.4% Ti | 0.49 | 0.198 | 0.197 | 0.88 |
| Ag—1.0% Zr | 0.52 | 0.229 | 0.224 | 0.93 |

In still another embodiment, the sputtering target and the thin film on the optical information storage medium is a silver alloy with a comparatively small addition of aluminum as alloying elements. In this embodiment, the relationship between the amounts of silver and aluminum ranges from about 0.01 a/o percent to about 5.0 a/o percent aluminum and from about 95.0 a/o percent to about 99.99 a/o percent silver. But preferably from about 0.1 a/o percent to about 3.0 a/o percent aluminum, and from about 97.0 a/o percent to about 99.9 a/o percent silver. This silver and aluminum binary alloy can be further alloyed with zinc, cadmium, lithium, manganese, nickel, titanium and zirconium or mixtures of these metals. In relation to the amount of silver that is present in the above silver and aluminum binary alloy, the amount of the above-identified metal that may be preferably added ranges from 0.01 a/o percent to about 5.0 a/o percent of the silver content.

For the convenience of the reader, the following are some combinations of silver alloys, where the alloying elements are identified by their periodic table symbols, which may be preferably alloyed with silver: Ag+Zn, or Ag+Cd, or Ag+Li, or Ag+Al, or Ag+Ni, or Ag+Mn, or Ag+Ti, or Ag+Zr, or Ag+Pd+Zn, or Ag+Pt+Zn, or Ag+Pd+Mn, or Ag+Pt+Mn, or Ag+Zn+Li, or Ag+Pt+Li, or Ag+Li+Mn, or Ag+Li+Al, or Ag+Ti+Zn, or Ag+Zr+Ni, or Ag+Al+Ti, or Ag+Pd+Ti or Ag+Pt+Ti, or Ag+Ni+Al, or Ag+Mn+Ti, or Ag+Zn+Zr, or Ag+Li+Zr, or Ag+Mn+Zn, or Ag+Mn+Cu, or Ag+Pd+Pt+Zn or Ag+Pd+Zn+Mn, or Ag+Zn+Mn+Li, or Ag+Cd+Mn+Li, or Ag+Pt+Zn+Li, or Ag+Al+Ni+Zn, or Ag+Al+Ni+Ti, or Ag+Zr+Ti+Cd, or Ag+Zr+Ni+Li, or Ag+Zr+Ni+Al, or Ag+Pt+Al+Ni, or Ag+Pd+Zn+Al, or Ag+Zr+Zn+Ti, or Ag+Ti+Ni+Al.

In another embodiment, silver can be alloyed additionally with indium, chromium, nickel, germanium, tin, antimony, gallium, silicon, boron, zirconium, molybdenum, magnesium, cobalt, bismuth, yttrium and scandium or mixture of these elements. In relation to the amount of silver that is present in the alloy systems, the amount of the above-identified elements that may be added ranges from about 0.01 a/o percent to about 5.0 a/o percent of the silver content. But more preferably, the amount of alloying elements added to silver may ranges from about 0.1 a/o percent to about 3.0 a/o percent. This is further illustrated in Table II for an optical information storage medium as presented in FIG. 3. All the optical property symbols in Table II have the same meaning as in Table I.

TABLE II

Balance of reflectivity of Layer 0 and Layer 1 of DVD-9 dual layer disc for various silver alloy Layer 0 and typical aluminum alloy Layer 1.

| Composition | $T_0$ | $R_0$ | $R_1'$ | R |
|---|---|---|---|---|
| Ag—2.5% In | 0.500 | 0.212 | 0.208 | 0.91 |
| Ag—1.2% Cr | 0.535 | 0.243 | 0.238 | 0.94 |
| Ag—0.7% Ge | 0.515 | 0.220 | 0.220 | 0.92 |
| Ag—1.0% Sn | 0.504 | 0.216 | 0.211 | 0.92 |
| Ag—0.5% Sb | 0.520 | 0.224 | 0.224 | 0.93 |
| Ag—3.0% Ga | 0.475 | 0.195 | 0.187 | 0.86 |
| Ag—1.5% Si | 0.490 | 0.202 | 0.199 | 0.90 |
| Ag—1.2% B | 0.513 | 0.247 | 0.218 | 0.92 |
| Ag—0.8% Mo | 0.515 | 0.220 | 0.218 | 0.92 |
| Ag—3.7% Mg | 0.538 | 0.24 | 0.233 | 0.96 |
| Ag—0.6% Bi | 0.517 | 0.222 | 0.217 | 0.945 |
| Ag—0.9% Co | 0.495 | 0.203 | 0.208 | 0.91 |
| Ag—0.4% Y | 0.511 | 0.217 | 0.214 | 0.91 |
| Ag—0.3% Sc | 0.518 | 0.223 | 0.226 | 0.94 |

It is well understood that the compositions listed in table I or Table II can also be used as the high reflectivity layer or layer 1 in a prerecorded dual layer optical disc structure such as DVD-9, DVD-14 or DVD-18, or in a tri-layer optical disc structure as in FIG. 4 or the high reflectivity layer in SACD or in a recordable optical disc such as DVD-R, DVD+R or in a rewritable optical disc such as DVD-RAM, DVD+RW or DVD-RW or rewritable disc with play back laser wavelength at about 400 nm or as the one illustrated in FIG. 5.

For the convenience of the reader, the following are some combination of silver alloys, where the alloying elements are identified by their periodic table symbols, which may be preferably alloyed with silver: Ag+In, or Ag+Cr, or Ag+Ge, or Ag+Sn, or Ag+Sb, or Ag+Ga, or Ag+Si, or Ag+B, or Ag+Mo, or Ag+In +Cr, or Ag+Cr+Ge, or Ag+Cr+Sn, or Ag+Cr+Sb, or Ag+Cr+Si, or Ag+Si+In, or Ag+Si+Sb, or Ag+Si+B, or Ag+Si+Mo, or Ag+Mo+In, or Ag+Mo+Sn, or Ag+Mo+B, or Ag+Mo+Sb, or Ag+Ge+B, or Ag+In +Cr+Ge, or Ag+Cr+Sn+Sb, or Ag+Ga+Si+Mo, or Ag+Cr+Si+Mo, or Ag+B+Mo+Cr, or Ag+In +Sb+B, or Ag+Cr+Si+B, Ag+Ga+ Ge+Cr, or Ag+Si+Ge+Mo or Ag+Sb+Si+B, or Ag+Cr+Si+ In, or Ag+Si+Cr+Sn.

The optical properties of a few of the ternary silver alloys of the application are further illustrated in Table III wherein the reflectivity and transmission as layer zero thin film in the thickness of about 8 to 12 nm in a DVD-9 dual layer disc construction are shown. The meaning of each symbol is the same as in Table I.

TABLE III

Balance of reflectivity of Layer 0 and Layer 1 of DVD-9 dual layer disc for various ternary silver alloy layer 0 and typical aluminum alloy Layer 1.

| Composition | $T_0$ | $R_0$ | $R_1'$ | R |
|---|---|---|---|---|
| Ag—1.2% Pd—1.4% Zn | 0.54 | 0.245 | 0.242 | 0.95 |
| Ag—0.8% Cu—1.5% Mn | 0.535 | 0.240 | 0.238 | 0.94 |
| Ag—1.5% Al—1.0% Mn | 0.50 | 0.213 | 0.208 | 0.91 |
| Ag—1.0% Cu—0.3% Ti | 0.50 | 0.210 | 0.207 | 0.90 |
| Ag—1.2% Al—1.3% Zn | 0.53 | 0.224 | 0.233 | 0.93 |
| Ag—1.0% Ge—0.7% Al | 0.49 | 0.203 | 0.201 | 0.89 |
| Ag—1.2% Sb—0.3% Li | 0.47 | 0.187 | 0.183 | 0.83 |
| Ag—0.8% Cu—1.5% Mg | 0.54 | 0.243 | 0.236 | 0.96 |
| Ag—1.0% Zn—0.4% Bi | 0.53 | 0.237 | 0.229 | 0.94 |
| Ag—2.5% Mg—0.7% Co | 0.51 | 0.221 | 0.225 | 0.90 |
| Ag—2.0% Mg—0.2% Y | 0.52 | 0.227 | 0.219 | 0.93 |
| Ag—0.7% Zn—0.3% Sc | 0.51 | 0.215 | 0.210 | 0.92 |

In still another embodiment, the sputtering target and the thin film on the optical information storage medium is a silver alloy with a comparatively small addition of copper as an alloying element in conjunction with other alloying elements selected from the group consisting of aluminum, nickel, manganese, titanium, zirconium, indium, chromium, germanium, tin, antimony, gallium, silicon, boron, molybdenum and mixtures thereof. In this embodiment, the relationship between the amounts of silver and copper ranges from about 0.01 a/o percent to about 5.0 a/o percent copper and from about 95.0 a/o percent to about 99.99 a/o percent silver. But preferably from about 0.1 a/o percent to about 3.0 a/o percent copper, and from about 97.0 a/o percent to about 99.9 a/o percent silver. In relationship to the amount of silver that is present in the alloy system, the amount of the above-identified elements that may be added ranges from 0.01 a/o percent to about 5.0% of the silver content. But more preferably, the amount of alloying elements added to silver may ranges from about 0.1 a/o percent to about 3.0 a/o percent. As data presented in Table I, II and III indicated, if the individual alloy addition to silver is more than 5.0 a/o percent, the balanced reflectivity between layer zero and layer one in the DVD-9 dual layer disc structure is likely to be lower than the DVD specification of 18 percent, therefore not composition with utility.

In still another embodiment, the sputtering target and the thin film on the optical information storage medium is a silver alloy with addition alloying elements selected form the group consisting of cobalt, bismuth, magnesium, yttrium, and scandium, and mixtures thereof. In this embodiment, the relationship between the amounts of silver and the other alloying elements ranges from about 0.01 a/o percent to about 5.0 a/o percent of the other alloying elements and from about 99.99 a/o percent silver to about 95.0 a/o percent silver. In yet another embodiment the amounts of the other alloying elements ranges from about 0.1 a/o percent to about 3.0 a/o percent with the silver concentration from about 99.9 a/o percent to about 97.0 a/o percent.

Still another embodiment, is a silver alloy with copper as a second alloy element, the amount of copper in the alloy varying from about 0.01 a/o percent to about 10.0 a/o percent can further alloyed with any of the following elements singly or in mixture such as samarium, neodymium, terbium, thallium, thulium, and ytterbium etc. of the rare earth family in the amount form about 0.01 a/o percent to about 5.0 a/o percent of the amount of silver present.

In yet another embodiment a silver copper alloy is further alloyed with magnesium, the amount of copper in the alloy varying from about 0.01 a/o percent to about 10.0 a/o percent, the amount of magnesium varying from about 0.01 to about 5.0 a/o percent of the amount of silver present. But preferably, the amount of magnesium ranges from about 0.1 a/o percent to about 3.0 a/o percent of the amount of silver present.

In yet another embodiment a silver copper alloy is further alloyed with cobalt, the amount of copper in the alloy varying from about 0.01 a/o percent to about 10.0 a/o percent of the amount of silver present, and the amount of cobalt varying from about 0.01 to about 5.0 a/o percent of the amount of silver present. But preferably, the amount of cobalt in the silver copper cobalt alloy ranges from about 0.1 a/o percent to about 3.0 a/o percent of the amount of silver present.

In still another embodiment a silver copper alloy is further alloyed with an additional element selected from the group of additional elements consisting of yttrium, bismuth, scandium and mixtures thereof. In this embodiment, the relationship between the amounts of silver, the amount of the additional element varying from about 0.01 a/o percent to about 5.0 a/o percent of the amount of silver present. But preferably, the additional element ranges from about 0.1 a/o percent to about 3.0 a/o percent of the amount of silver present.

In another embodiment silver is alloyed with a comparatively small amount of zinc and magnesium. In this embodiment, the relationship between the amounts of zinc silver and magnesium ranges from about 0.01 a/o percent (atomic percent) to about 15 a/o percent zinc and from about 85 a/o percent to about 99.99 a/o percent silver, the amount of magnesium ranges from about 0.01 a/o percent to about 5.0 a/o percent of the amount of silver present. But preferably the silver, zinc, magnesium alloy comprises about 0.01 a/o percent to about 10.0 a/o percent zinc of the amount of silver present, and about 0.01 a/o percent to 5.0 a/o percent magnesium of the amount of silver present.

In another embodiment, silver is alloyed with a comparatively small amount of zinc and cobalt. In this embodiment, the relationship between the amounts of zinc silver and cobalt ranges from about 0.01 a/o percent (atomic percent) to about 15 a/o percent zinc and from about 80 a/o percent to about 99.99 a/o percent silver, the amount of cobalt ranges from about 0.01 a/o percent to about 5.0 a/o percent of the amount of silver present. In one embodiment the silver zinc cobalt alloy comprises about 0.01 a/o percent to about 10.0 a/o percent zinc, and about 0.01 to about 5.0 a/o percent cobalt of the amount of silver present.

In still another embodiment a silver zinc alloy is further alloyed with an additional element selected from the group of additional elements consisting of yttrium, bismuth, scandium, and mixtures thereof. In this embodiment, the relationship between the amounts of silver, the amount of the additional element varying from about 0.01 a/o percent to about 5.0 a/o percent of the amount of silver present. But preferably, the additional element ranges from about 0.1 a/o percent to about 3.0 a/o percent of the amount of silver present.

Having presented the preceding compositions for the thin film materials, it is important to recognize that both the manufacturing process of the sputtering target and the process to deposit the target material into a thin film play important roles in determining the final properties of the film. To this end, a preferred method of making the sputtering target will now be described. In general, vacuum melting and casting of the alloys or melting and casting under protective atmosphere, are preferred to minimize the introduction of other unwanted impurities.

Afterwards, the as-cast ingot should undergo a cold working process to break down the segregation and the non-uniform as-cast microstructure. One preferred method is cold forging or cold uniaxial compression with more than 50 percent of size reduction, followed by annealing to re-crystallize the deformed material into fine equi-axed grain structure with preferred texture of <1,1,0> orientation. This texture promotes directional sputtering in a sputtering apparatus so that more of the atoms from the sputtering target will be deposited onto the disc substrates for more efficient use of the target material.

Alternatively, a cold multi-directional rolling process of more than 50 percent size reduction can be employed, followed by annealing to promote a random oriented microstructure in the target and finally by machining to the final shape and size suitable for a given sputtering apparatus. This target with random crystal orientation will lead to a more random ejection of atoms from the target during sputtering and a more uniform thickness distribution in the disc substrate.

Depending on different discs' optical and other system requirements, either a cold forging or a cold multi-directional rolling process can be employed in the target manufacturing process to optimize the optical and other performance requirements of the thin film for a given application.

The alloys of this invention can be deposited in the well-known manners described earlier, those being sputtering, thermal evaporation or physical vapor deposition, and possibly electrolytic or electroless plating processes. Depending on the method of application, the alloy thin film's reflectivity could vary. Any application method that adds impurities to or changes the surface morphology of the thin film layer on the disc could conceivably lower the reflectivity of the layer. But to the first order of approximation, the reflectivity of the thin film layer on the optical disc is primarily determined by the starting material of the sputtering target, evaporation source material, or the purity and composition of the electrolytic and electroless plating chemicals.

It should be understood that the alloys of this invention can be used for future generations of optical discs that use a reading laser of a shorter wavelength, for example, when the reading laser's wavelength is shorter than 650 nanometers.

It should also be understood that, if the reflective film is reduced to a thickness of approximately 5 to 20 nanometers, a semi-reflective film layer can be formed from the alloys of this invention provided that they have sufficient light transmittance for use in DVD dual-layer applications.

EXAMPLES

Example 1

An alloy composition of silver with approximately 1.2 atomic percent chromium and approximately 1.0 atomic percent zinc will have a reflectivity of approximately 94 to 95 percent at the wavelength of 800 nanometers and a reflectivity of approximately 93 to 94 percent at the wavelength of 650 nanometers and a reflectivity of approximately 86 to 88 percent at the wavelength of 400 nanometers with the film thickness at about 60 to 100 nanometers.

Example 2

A silver-rich alloy with 1.5 a/o percent of manganese, 0.8 a/o percent of copper will have a reflectivity of approximately 94 to 95 percent at 650 nanometers wavelength. If the thickness of the thin film is reduced to the 8 to 12 nanometers range, the reflectivity will be reduced to the 18 to 30 percent range applicable for DVD-9's semi-reflective layer. Adding a low concentration of deoxidizer such as lithium can further simplify the manufacturing process of the starting material of the thin film. As silver has a tendency to dissolve some oxygen in the solid state which tends to lower the reflectivity of the alloy, the added lithium will react with the oxygen and lessen the degree of oxygen's impact to reflectivity. The desirable range of lithium is in the approximate range of 0.01 percent to 5.0 atomic percent, with the preferred range from about 0.1 to 1.0 a/o percent.

Example 3

A silver based alloy with about 0.5 a/o percent of nickel and about 0.5 a/o percent of zinc will have a reflectivity of approximately 95 percent at the wavelength of about 650 nanometers at a thickness of 60 to 70 nanometers and is suitable for any high reflectivity application in an optical information storage medium.

Example 4

Another silver based alloy sputtering target with the composition of about 1.0 a/o percent manganese, 0.3 a/o percent titanium and the balance silver is employed to produce the semi-reflective layer of the DVD-9 dual layer disc with the following procedure: On top of a transparent polycarbonate half disc of approximately 0.6 millimeter thickness and 12 centimeter in diameter with information pits injection molded from a suitable stamper, a semi-reflective thin film or layer "zero" of silver based alloy approximately 10 to 11 nanometers in thickness is deposited or coated onto the half disc using the sputtering target of the above-mentioned composition in a magnetron sputtering machine. On top of another transparent polycarbonate half disc of approximately 0.6 millimeter thickness with information pits injection molded from another suitable stamper, a high reflectivity thin film or layer "one" of and aluminum based alloy approximately 55 nanometers in thickness is deposited using a suitable aluminum sputtering target in another sputtering machine. These two half discs are then spin-coated with suitable liquid organic resins separately, bonded together with layer "zero" and layer "one" facing each other and the resin is cured with ultraviolet light. The distance between the layer "zero" and the layer "one" is kept at about 55+/−5 microns within the disc. The reflectivity of the two information layers is measured from the same side of the disc and found to be about the same at 21 percent for the 650 nanometers wavelength laser light. Electronic signal such as jitter and PI error are measured and found to be within the published DVD specifications. Subsequently, an accelerated aging test at 80 degrees C. and 85 percent relative humidity for 4 days is conducted on the disc. Afterwards, the reflectivity and the electronic signals are measured again and no significant changes were observed as compared to the same measurements before the aging test.

Example 5

A silver alloy sputtering target with the composition in atomic percent of about 0.2 percent lithium, 1.0 percent manganese, 0.3 percent germanium and the balance silver is employed to produce the semi-reflective layer of the DVD-9 dual layer disc. The procedure used to make the discs is the same as in example 4 above. The reflectivity of the two information layer in the finished disc is measured from the same side of the disc and found to be about the same at 22.5 percent for the 650 nanometers wavelength laser light. Electronic signals such as jitter and PI error are also measured and found to be within the published DVD specifications. Subsequently, an accelerated aging test at 70 degrees C. and 50 percent relative humidity for 96 hours is conducted on the disc. Afterwards, the reflectivity and the electronic signals are measured again and no significant changes are observed as compared to the same measurements before the aging test.

It is understood that the same silver alloy thin film in this example deposited on the disc in the thickness range from about 30 to about 200 nanometers range can serve the purpose of the high reflectivity layer such as Layer "one" in DVD-9, or Layer "two" in a tri-layer optical disc as in FIG. 4 or other high reflectivity application in a rewritable optical disc such as DVD-RW, DVD-RAM in a general structure as illustrated in FIG. 5 at 650 nanometers wavelength or any other future optical information storage medium played back at around 400 nanometers wavelength.

Example 6

A silver based alloy sputtering target with the composition in a/o % of approximately 1.3% manganese, 0.7% aluminum, and the balance silver is used to produce the reflective layer of a DVD-R disc, another type of recordable disc according to FIG. 2 with the following procedure: On top of a transparent polycarbonate half disc of about 0.6 mm thickness and 12 cm in diameter with pregrooves suitable for DVD-R injection molded from a suitable stamper, a cyanine based recording dye is spin-coated on the substrate, dried, and subsequently a reflective layer of silver based alloy approximately 60 nm in thickness is deposited or coated on the recording dye using the sputtering target of the above mentioned composition in a magnetron sputtering machine. Afterwards, this half disc is bonded to another 0.6 mm thickness half disc by a UV cured resin. Information is recorded onto the disc in a DVD-R recorder and the quality of the electronic signal is measured. Then the disc is subjected to an accelerated aging test at 80 degrees C. and 85% RH for 96 hours. Afterwards, the reflectivity and the electronic signal is measured again and no significant changes are observed as compared to the same measurements before aging test.

Example 7

A process to make the sputtering target with the composition as indicated in example 6 will be described hereafter. Suitable charges of silver, manganese and aluminum are put into the crucible of a suitable vacuum induction furnace. The vacuum furnace is pumped down to vacuum pressure of approximately 1 milli-torr and then induction heating is used to heat the charge. While the charge is heating up and the out gassing is finished, the furnace can be back filled with argon gas to a pressure of about 0.2 to 0.4 atmosphere. Casting of the liquid melt can be accomplished at a temperature of approximately 10% above the melting point of the charge. The graphite crucible holding the melt can be equipped with a graphite stopper at the bottom of the crucible. Pouring of the molten metal into individual molds of each sputtering target can be accomplished by opening and closing of the graphite stopper and synchronizing this action with mechanically bringing each mold into position just underneath the melting crucible so that the proper amount of melt can be poured and cast into each target mold by gravity. Afterwards, additional argon flow into the vacuum furnace can be introduced to cool and quench the casting to lower temperature. Subsequently, a cold or warm multi-directional rolling process with more than 50% thickness reduction can be used to break up any nonuniform casting microstructure. Then final anneal is done at 550 to 600 degrees C. in a protective atmosphere for 15 to 30 minutes. After machining the target piece into the right shape and size, cleaning in detergent and properly dried, the finished sputtering target is ready to be put into a magnetron sputtering apparatus to coat optical discs. The approximate sputtering parameters to make the semi-reflective layer of an ultra high density optical disc with playback laser wavelength at 400 nanometers as mentioned in example 9 are 1 kilowatt of sputtering power, 1 second of sputtering time at an argon partial pressure of 1 to 3 mili-torr for a deposition rate of 10 nanometers per second with the target to disc distance of approximately 4 to 6 centimeters. The high reflectivity layer can be made with about the same sputtering parameters as the semi-reflective layer except the sputtering power needs to be increased to 4 to 5 kilowatts to deposit the high reflectivity layer using the same sputtering target and sputtering apparatus. Thus a 5 inch diameter ultra high density read-only optical disc can be made in this manner with user storage capacity of about 12 to 15 giga bytes per side. A dual layer disc with the construction as shown in FIG. 3, can store approximately 24 to 30 giga bytes of information, enough for a full length motion picture in the high-definition digital television format.

Example 8

A silver alloy sputtering target having the composition in a/o %: Pd, 1.2%, Zn, 1.4% and balance silver was used to produce a dual layer optical information storage medium as depicted in FIG. 3. Thin film about 10 nanometers thickness of this silver alloy was deposited by a magnetron sputtering machine on a suitable polycarbonate substrate. The feasibility of using the same silver alloy thin film for both the reflective layer and the semi-reflective layer of a dual layer ultra high density read-only optical disc with a playback laser wavelength at 400 nanometers is investigated. As indicated in FIG. 3, the indices of refraction n of the transparent substrate 214, the semi-reflective layer 216, the spacer layer 218 and the high reflectivity layer are 1.605, 0.035, 1.52, 0.035 respectively. The extinction coefficient k for the semi-reflective layer and the high reflectivity layer is 2.0. Calculation shows that with a thickness of 24 nm, the semi-reflective layer will have a reflectivity $R_0$ of 0.242 and a transmission $T_0$ of 0.600 in the disc at 400 nm wavelength. With a thickness of 55 nm, the high reflectivity layer will have a reflectivity $R_1$ of 0.685. The reflectivity of the high reflectivity layer measured from outside the disc through the semi-reflective layer will be $R_0 = R_1 T_0^2$ or 0.247. In other words, to the detector outside the disc, the reflectivity from both the semi-reflective layer and the high reflectivity layer will be approximately the same. This fulfills one of the important requirements of a dual layered optical information storage medium that the reflectivity from these 2 layers of information should be approximately equal and the relationship between the optical properties of these two layers is $R_0 = R_1 T_0^2$.

Example 9

The same silver alloy in example 8 can also be used as the high reflectivity layer and the two semi-reflective layers in a tri-layer optical information storage medium as depicted in FIG. 4 at 400 nm playback laser wavelength. Calculations show that for a thickness of 16 nm for the first semi-reflective layer 316, a thickness of 24 nm for the second semi-reflective layer 320 and a thickness of 50 nm for the high reflectivity layer 324 in FIG. 4, the reflectivity measured at the detector 332 will be 0.132, 0.137, 0.131 respectively from the three layers. And approximately the same reflectivity from all three layers can be achieved. Thus balance of reflectivity from three information layers using the same silver alloy can be achieved and one sputtering machine and one silver alloy sputtering target can be used to manufacture all three layers of an ultra high density tri-layer optical information storage medium with playback laser wavelength at 400 nm in a production environment. It will be obvious that the aluminum alloys can also be used for the high reflectivity layer of this tri-layer medium Example 10

A silver alloy sputtering target having the composition in a/o %: Au, 2.6%; Pd, 1.1%; Pt, 0.3%; Cu, 0.4% and balance silver was used to produce the high reflectivity layer in a rewritable phase change disc structure or DVD+RW as shown in FIG. 5. On the 0.6 mm thickness polycarbonate substrate with continuous spiral tracks of grooves and lands injection molded form a suitable stamper, successive layers of $ZnO.SiO_2$, Ag—In—Sb—Te, and $ZnO.SiO_2$ with suitable thickness are coated on the substrate. Afterwards the sputtering target of the above composition is used in a magnetron sputtering apparatus to deposit about 150 nm thickness of the silver alloy film on top of the $ZnO.SiO_2$ film. Subsequently, the half disc is bonded with a suitable adhesive to the other 0.6 mm thickness half disc with the same construction as mentioned above to form the complete disc. Repeated record and erase cycles are performed in a suitable DVD+RW drive. The disc meets the performance requirements imposed on the recording medium. The disc further goes through an accelerated environmental test at 80 degrees C., 85% relative humidity for 10 days. Afterwards, the disc performance is checked again, no significant change in the disc property is observed as compared to the disc performance before the environmental test.

Example 11

A silver alloy sputtering target having the composition in a/o %: Cu, 1.0%; Ag, 99.0% was used to produce the highly reflective layer in a rewritable phase change disc structure or "DVR" as shown in FIG. 6 except that between the dielectric layer 520 and the highly reflective layer 522, there is an interface layer of SiC (not shown). Compared to Example 10, layers in the disc in this example are deposited in the reverse order. The transparent substrate 524 was made of polycarbonate and injection molded from a suitable stamper, then the silver alloy reflective layer was deposited on the transparent substrate using the above-mentioned sputtering target in a magnetron sputtering apparatus. The dielectric layer 520 (preferably $ZnO.SiO_2$), the recording layer 518 (preferably Ag—In—Sb—Te), another dielectric layer 516 (preferably $ZnO.SiO_2$) and the interface layer (preferably SiC) were then vacuum coated in sequence. Lastly, the disc was coated by a covering layer of UV cured resin 514 10 to 15 microns in thickness. The performance of the disc was verified with a DVR type of player with 400 nm wavelength laser beam recording and play back system. Repeated record and erase cycles were conducted satisfactorily. Afterwards, the disc was further subjected to an accelerated environmental test condition of about 80 degrees C. and 85% relative humidity for 4 days. The performance of the disc was again checked and verified. No significant degradation of the disc property was observed.

Example 12

A silver alloy sputtering target having a composition given in a/o % of: Cu, 1.0%; Ag, 99.0% was used to produce the highly reflective layer in a rewritable phase change disc structure or "DVR" as shown in FIG. 6. In this DVR structure, between dielectric layer 520 and highly reflective layer 522, there is an interface layer of SiC (not shown). The layers in this example are deposited in the reverse order from the order of layer addition used in Example 10. The transparent substrate 524 was made of polycarbonate and injection molded from a suitable stamper, then the silver alloy reflective layer was deposited on the transparent substrate using the above-mentioned sputtering target in a magnetron sputtering apparatus. Dielectric layer 520 (preferably $ZnO.SiO_2$), recording layer 518 (preferably Ag—In—Sb—Te), another dielectric layer 516 (preferably ZnO.SiO$_2$) and an interface layer (preferably SiC) were then vacuum coated, in sequence. Finally, the disc was covered with a layer of UV cured resin 514, about 100 microns thick.

The performance of the disc is verified with a DVR type recording and play back system using a 405 nm wavelength laser beam. Repeated record and erase cycles are conducted satisfactorily. The disc is subjected to an accelerated environmental test at 80 degrees C. and 85% relative humidity for 4 days. The performance of the disc is again checked and verified. No significant degradation of the disc's property is observed.

Example 13

A silver based alloy sputtering target with a composition in a/o % of approximately 2.2% copper, 0.5% zinc, and the balance silver is used to produce the semi-reflective layer or L0 of another type of recordable disc such as a DVD-R dual-layer disc or a DVD+R dual-layer disc as shown in FIG. 13 using the following procedure. An azo based recording dye is spin-coated on top of a transparent polycarbonate half disc about 0.6 mm thick and 12 cm in diameter with pregrooves suitable for DVD-R dual-layer or DVD+R dual-layer injection molded by a suitable stamper, and, dried. Subsequently, a semi-reflective layer of silver based alloy approximately 10 nm in thickness is deposited or coated on the recording dye using the sputtering target with the aforementioned composition in a magnetron sputtering machine. Afterwards, this half disc is bonded to the other 0.6 mm thickness half disc using a UV cured resin. The other half disc contains 150 nm thickness of silver alloy sputtered from another sputtering target of the composition: 1.7 a/o % Cu, 1.0 a/o % Zn and 97.3 a/o % Ag on the clear polycarbonate substrate and subsequently coated with another Azo based recording dye and dried by hot circulating air. Information is recorded onto both layers of the disc in a DVD-R dual-layer or DVD+R dual-layer recorder and the quality of the electronic signal is measured. The disc is then subjected to an accelerated aging test at 80 degrees C. and 85% RH for 2 days. Afterwards, the reflectivity and the electronic signals of the disc are measured again and no significant changes are observed as compared to the same measurements before the aging test.

In view of the figures, description, and examples additional embodiments include the following embodiments.

In one embodiment, an optical storage medium, comprising: a first layer having a pattern of features in at least one major surface; and a first coating adjacent the first layer, the first coating includes a first metal alloy; wherein the first metal alloy comprises: silver; and at least one other element, selected from the group comprising copper, zinc, silicon, cadmium, tin, lithium, nickel, cobalt, indium, chromium, antimony, gallium, boron, molybdenum, zirconium, beryllium, germanium, aluminum, manganese, titanium, yttrium, scandium, cobalt, bismuth, and magnesium, wherein said other elements may be present from about 0.01 a/o percent to about 15.0 a/o percent of the amount of silver present. In another embodiment said other elements may be present from present from about 0.01 a/o percent to about 10.0 a/o percent of the amount of silver present. In still another embodiment said other elements may be present from present from about 0.01 a/o percent to about 5.0 a/o percent of the amount of silver present. And in still another embodiment said other elements may be present from present from about 0.01 a/o percent to about 3.0 a/o percent of the amount of silver present.

In another embodiment, the first coating of the optical storage medium may directly contact the first metal layer of the medium.

In another embodiment, the medium may further comprise a second layer having a pattern of features in at least one major surface and a second coating adjacent to the second layer. The second layer may include a dielectric material. Additionally, the medium may include a third layer having a pattern of features in at least one major surface, the third layer including an optically recordable material and a fourth layer having a pattern of features in at least one major surface, the fourth layer may include a dielectric material.

In another embodiment, an optical storage medium has a substrate with a pattern of features in at least one major surface and a recording layer adjacent the feature pattern. A semi-reflective layer then resides adjacent the recording layer. The optical storage medium may also have a second substrate with a pattern of features in at least one major surface, a second recording layer adjacent the feature pattern, and a second reflective layer adjacent the recording layer. A space layer is then located between the first and second substrates. In one embodiment at least one of the reflective or semi-reflective coatings are made of, for example, silver and copper wherein the relationship between the amounts of silver and copper is defined by $Ag_xCu_t$ where $0.90<x<0.999$ and $0.001<t<0.10$.

Still another embodiment is an optical storage medium comprising a first layer having a pattern of features in at least one major surface and a semi-reflective layer adjacent to the first feature pattern. The semi-reflective layer or coating can be comprised of any of the metal alloys of the invention suitable for use in a semi-reflective layer and compatible for use with a laser in the range of 405 nm. The storage medium further includes a second layer having a pattern of features in at least one major surface and a highly reflective layer or coating adjacent to the second pattern of features. In one embodiment the first pattern of features includes a spiral groove.

Yet another embodiment provides an optical storage device including, in addition to a first layer and second layer each having feature patterns, a fourth layer including an optically recordable material positioned between a third layer including a dielectric material and a fifth layer including a dielectric material. Optical recording layer 4 and dielectric layers 3 and 5 are positioned between the first layer and the second layer. In one embodiment the feature pattern in either, or both, the first and second layers comprise a spiral groove either with or without data pits.

In one embodiment, the recordable material in layer 4 is a phase changeable material.

In still another embodiment, the recordable material in layer 4 is magnetic optical recordable material.

In yet another embodiment, the recordable material in layer 4 is an optically active dye.

In another embodiment, the optically recordable material is a phase-changeable material. The optically recordable material may comprise a phase changeable materials selected from the group consisting of Ge—Sb—Te, As—In—Sb—Te, Cr—Ge—Sb—Te, As—Te—Ge, Te—Ge—Sn, Te—Ge—Sn—O, Te—Se, Sn—Te—Se, Te—Ge—Sn—Au, Ge—Sb—Te, Sb—Te—Se, In—Se—Tl, In Sb, In—Sb—Se, In—Se—Tl—Co, Bi—Ge, Bi—Ge—Sb, Bi—Ge—Te, and Si—Te—Sn. The optically recordable material may be a magneto-optic material selected for example from the group consisting of Tb—Fe—Co and Gd—Tb—Fe.

In another embodiment, the first metal alloy in a layer of an optical recording medium. The metal alloy may comprise, for example, copper, zinc, and silver wherein copper is present from about 0.01 a/o percent to about 10.0 a/o percent, zinc is present from about 0.01 a/o percent to 10.0 a/o, of the amount of silver present. In another embodiment the silver copper alloy further comprises cobalt or magnesium, wherein cobalt or magnesium are present from about 0.01 a/o to about 5.0 a/o percent of the amount of silver present Another embodiment consists of a metal alloy in a layer of an optical recording medium, the alloy may comprise copper, titanium, and silver, wherein copper is present in about 0.01 a/o percent to about 10.0 a/o percent of the amount of silver present, and titanium is present from about 0.01 a/o percent to about 5.0 a/o percent of the amount of silver present in the alloy.

Another embodiment is a metal alloy in a layer of an optical recording medium may comprise silver; and at least one other metal selected from the group consisting of gold, rhodium, ruthenium, osmium, iridium, platinum, palladium, and mixtures thereof, wherein at least one of these metals is present from about 0.01 a/o percent to about 5.0 a/o percent of the amount of silver present.

In another embodiment, the metal alloy in a layer of an optical recording medium may comprise silver, copper, and silicon, wherein copper is present from about 0.01 a/o percent to about 10.0 a/o percent of the amount of silver present, and silicon is present from about 0.01 a/o percent to about 5.0 a/o percent of the amount of silver present.

In another embodiment, the metal alloy in a layer of an optical recording medium may comprise silver, copper, and magnesium or cobalt, wherein copper is present from about 0.01 a/o percent to about 10.0 a/o percent of the amount of silver present, and magnesium or cobalt is present from about 0.01 a/o percent to about 5.0 a/o percent of the amount of silver present.

Still another embodiment is an optical information recording medium, comprising: a first substrate having a pattern of features in at least one major surface; a first recording layer adjacent the feature pattern; and a first reflective layer adjacent to the first recording layer. The reflective layer includes a first metal alloy; wherein the first metal alloy comprises: silver; and at least one other element selected from the group consisting of copper, zinc, titanium, cadmium, lithium, nickel, cobalt, indium, aluminum, germanium, chromium, germanium, tin, beryllium, magnesium, manganese, antimony, gallium, silicon, boron, zirconium, molybdenum, and mixtures thereof, wherein said other elements are present from 0.01 a/o percent to 10.0 a/o percent of the amount of silver present. In another embodiment, the other elements of the aforementioned metal alloy are present from about 0.1 a/o percent to 5.0 a/o percent of the amount of silver present in the alloy.

In one embodiment, the first recording layer of an optical information recording medium may directly contact the first metal layer.

Another embodiment is a metal alloy in an optical recording medium, wherein the metal alloy comprises silver, copper, and zinc wherein copper is present from about 0.01 a/o percent to 10.0 a/o percent of the amount of silver present, and zinc is present from about 0.01 a/o percent to 10.0 a/o percent of the amount of silver present.

Another embodiment is a metal alloy in a layer of an optical recording medium comprised of silver and at least one element selected from the group consisting of gold, rhodium, ruthenium, osmium, iridium, platinum, palladium, and mixtures thereof, wherein the element is present from about 0.01 a/o percent to 5.0 a/o percent of the amount of silver present.

Yet another embodiment is an optical storage medium, comprising: a first substrate having a pattern of features in at least one major surface; a semi-reflective layer adjacent a feature pattern, the semi-reflective layer including a metal alloy; the metal alloy comprising: silver; and copper; wherein the relationship between the amounts of silver and copper is defined by $Ag_xCu_y$, where $0.90<x<0.999$, $0.001<y<0.10$; a second substrate having a pattern of features in at least one major surface; a high reflective layer adjacent the feature pattern of the second substrate; and at least one spacer layer, located between said first and second substrates.

The aforementioned medium may further include a second substrate having a pattern of features in at least one major surface and a second reflective layer adjacent the second substrate. The metal alloy may also be comprised of at least one additional element selected from the group consisting of silicon, cadmium, tin, lithium, nickel, cobalt, indium, chromium, antimony, gallium, boron, molybdenum, zirconium, beryllium, titanium, magnesium, wherein the elements are present from about 0.01 a/o percent to 10.0 a/o percent of the amount of silver present.

In still another embodiment, the first metal alloy in an optical storage medium with both reflective and semi-reflective layers, comprising $Ag_xCu_y$, where $0.90<x<0.999$, $0.001<y<0.10$, includes manganese present from about 0.01 a/o percent to about 7.5 a/o percent of the amount of silver present.

In still another embodiment, the metal alloy in an optical storage medium with both reflective and semi-reflective layers, comprising $Ag_xCu_y$, where $0.90<x<0.999$, $0.001<y<0.10$, includes manganese present from about 0.01 a/o percent to about 5.0 a/o percent of the amount of silver present.

In still another embodiment, the metal alloy in an optical storage medium with both reflective and semi-reflective layers, comprising $Ag_xCu_y$, where $0.90<x<0.999$, $0.001<y<0.10$, includes titanium present from about 0.01 a/o percent to about 5.0 a/o percent of the amount of silver present.

In still another embodiment, the metal alloy in an optical storage medium with both reflective and semi-reflective layers, comprising $Ag_xCu_y$, where $0.90<x<0.999$, $0.001<y<0.10$, and said alloy further includes silicon present from about 0.01 a/o percent to about 5.0 a/o percent of the amount of silver present.

In another embodiment, the semi-reflective layer of optical storage medium includes a metal alloy comprising $Ag_xCu_y$, wherein $0.95<x<0.999$, $0.001<y<0.050$.

In another embodiment, an optical storage medium has at least one semi-reflective layer comprising a metal alloy including $Ag_xCu_y$, wherein $0.95<x<0.999$, $0.001<y<0.050$.

In another embodiment, the semi-reflective layer of an optical storage medium directly contacts the first metal alloy of the medium.

In another embodiment, an optical information recording medium may further include a second substrate having a pattern of features in at least one major surface and spacer layer located between the first and second substrates.

One embodiment is an optical storage medium with a first substrate having a pattern of features in at least one major surface and a first reflective layer adjacent the feature pattern. The reflective layer comprises silver and zinc alloy wherein the relationship between the amount of silver and the amount of zinc is defined by $Ag_xZn_y$, where $0.85<x<0.9999$ and $0.0001<y<0.15$.

Another embodiment is an optical storage medium with a first substrate having a pattern of features in at least one major surface and a first reflective layer adjacent the feature pattern. The reflective comprises a silver and aluminum alloy where the relationship between the amount of silver and the amount of aluminum is defined by $Ag_xAl_z$, where $0.95<x<0.9999$ and $0.0001<z<0.05$.

Still another embodiment is an optical storage medium with a first substrate having a pattern of features in at least one major surface and a first reflective layer adjacent the feature pattern. The reflective layer comprises a silver and zinc and aluminum alloy where the relationship between the amount of silver and the amount of zinc and the amount of aluminum is defined by $Ag_xZn_yAl_z$, where $0.80<x<0.998$ and $0.001<y<0.15$, and $0.001<z<0.05$.

Yet another embodiment is an optical storage medium with a first substrate having a pattern of features in at least one major surface and a first reflective layer adjacent the feature pattern. The reflective layer comprises a silver and manganese alloy where the relationship between the amount of silver and manganese is defined by $Ag_xMn_t$, where $0.925<x<0.9999$ and $0.0001<t<0.075$.

Another embodiment is an optical storage medium with a first substrate having a pattern of features in at least one major surface and a first reflective layer adjacent the feature pattern. The reflective layer comprises silver and germanium alloy wherein the relationship between the amount of silver and the amount of germanium is defined by $Ag_xGe_q$, where $0.97<x<0.9999$ and $0.0001<q<0.03$.

Another embodiment is an optical storage medium with a first substrate having a pattern of features in at least one major surface and a first reflective layer adjacent the feature pattern. The reflective layer comprises a silver, copper, and manganese alloy wherein the relationship between the amount of silver and the amount of copper and the amount of manganese is defined by $Ag_xCu_pMn_t$, where $0.825<x<0.9998$ and $0.0001<p<0.10$, and $0.0001<t<0.075$.

Another embodiment is an optical storage medium with a first substrate having a pattern of features in at least one major surface and a first reflective layer adjacent the feature pattern. The reflective layer comprises a silver and yttrium alloy wherein the relationship between the amounts of silver and yttrium is defined by $Ag_xY_w$, where $0.95<x<0.9999$ and $0.0001<w<0.05$. In another embodiment the amount of yttrium in the silver yttrium alloy is defined by $0.0001<w<0.03$.

Another embodiment is an optical storage medium with a first substrate having a pattern of features in at least one major surface and a first reflective layer adjacent the feature pattern. The reflective layer comprises a silver and scandium alloy wherein the relationship between the amounts of silver and scandium is defined by $Ag_xSc_w$, where $0.95<x<0.9999$ and $0.0001<w<0.05$. In another embodiment the amount of scandium in the silver scandium alloy is defined by $0.0001<w<0.03$.

Another embodiment is an optical storage medium with a first substrate having a pattern of features in at least one major surface and a first reflective layer adjacent the feature pattern. The reflective layer comprises a silver and bismuth alloy wherein the relationship between the amounts of silver and bismuth is defined by $Ag_xBi_w$, where $0.95<x<0.9999$ and $0.0001<w<0.05$. In another embodiment the amount of bismuth in the silver bismuth alloy is defined by $0.0001<w<0.03$.

Another embodiment is an optical storage medium with a first substrate having a pattern of features in at least one major surface and a first reflective layer adjacent the feature pattern. The reflective layer comprises a metal alloy including silver and copper further alloyed with at least one element A, element A selected from the group of elements comprising yttrium, scandium, and bismuth wherein the relationship between the amounts of silver, copper, and element A is defined by $Ag_xCu_zA_w$, where $0.85<x<0.9998$, $0.0001<z<0.10$, and $0.0001<w<0.05$. In another embodiment the amount of element A in the silver, copper, element A alloy is defined by $0.0001<w<0.03$.

Another embodiment is an optical storage medium with a first substrate having a pattern of features in at least one major surface and a first reflective layer adjacent the feature pattern. The reflective layer comprises a metal alloy including silver, copper, and cobalt wherein the relationship between the amounts of silver, copper, and cobalt is defined by $Ag_xCu_zCo_w$, where $0.85<x<0.9998$, $0.0001<z<0.10$, and $0.0001<w<0.05$. In another embodiment the amount of cobalt in the silver, copper, cobalt alloy is defined by $0.0001<w<0.03$.

Another embodiment is an optical storage medium with a first substrate having a pattern of features in at least one major surface and a first reflective layer adjacent the feature pattern. The reflective layer comprises a metal alloy including silver, copper, and magnesium, wherein the relationship between the amounts of silver, copper, and magnesium is defined by $Ag_xCu_zMg_w$, where $0.85<x<0.9998$, $0.0001<z<0.10$, and $0.0001<w<0.05$. In another embodiment the amount of magnesium in the silver, copper, magnesium alloy is defined by $0.0001<w<0.03$.

Another embodiment is an optical storage medium with a first substrate having a pattern of features in at least one major surface and a first reflective layer adjacent the feature pattern. The reflective layer comprises a metal alloy including silver, copper and cobalt, wherein the relationship between the amounts of silver, copper, and cobalt is defined by $Ag_xCu_zCo_w$, where $0.85<x<0.9998$, $0.0001<z<0.10$, and $0.0001<w<0.05$. In another embodiment the amount of cobalt in the silver, copper, cobalt, alloy is defined by $0.0001<w<0.03$.

Another embodiment is an optical storage medium with a first substrate having a pattern of features in at least one major surface and a first reflective layer adjacent the feature pattern. The reflective layer comprises a metal alloy including silver, zinc, and magnesium, wherein the relationship between the amounts of silver, zinc, and magnesium is defined by $Ag_xZn_yMg_w$, where $0.80<x<0.9998$, $0.0001<y<0.15$, and $0.0001<w<0.05$. In another embodiment the amount of magnesium in the silver, zinc, magnesium alloy is defined by $0.0001<w<0.03$.

Another embodiment is an optical storage medium with a first substrate having a pattern of features in at least one major surface and a first reflective layer adjacent the feature pattern. The reflective layer comprises a metal alloy including silver, zinc, and cobalt, wherein the relationship between the amounts of silver, zinc, and cobalt is defined by $Ag_xZn_yCo_w$, where $0.80<x<0.9998$, $0.0001<y<0.15$, and $0.0001<w<0.05$. In another embodiment the amount of cobalt in the silver, zinc, cobalt alloy is defined by $0.0001<w<0.03$.

In addition to the alloys uniquely disclosed and discussed herein for use in optical data storage devices, specific metal alloys that may be used as high reflective layers, surfaces, or coatings as well as specific metal alloys that may used as semi-reflective layers, surfaces, or coatings in optical data storage devices device can be found in U.S. Pat. Nos. 6,007,889; 6,280,811, 6,451,402, and 6,544,616 to Nee; as well as in U.S. Publications: 2003-0138591; and 2003-0215598 by Nee, the disclosures of which are hereby incorporated by reference.

THE CLAIMS

While the invention has been illustrated and described in detail, this is to be considered as illustrative and not restrictive of the patent rights. The reader should understand that only the preferred embodiments have been presented and all changes and modifications that come within the spirit of the invention are included if the following claims or the legal equivalent of these claims describes them.

I claim:

1. An optical storage medium, comprising:
a first layer having a pattern of features in at least one major surface;
a reflective coating;
said reflective coating including a metal alloy, said metal alloy including silver and yttrium, wherein the relationship between the amounts of silver and yttrium in the metal alloy is defined by $Ag_xY_w$ where $0.9500<x<0.9999$ and $0.0001<w<0.05$, wherein said reflective coating is about 60 nanometers thick or less.

2. The optical storage medium of claim 1, wherein $0.001<w<0.03$.

3. The optical storage medium of claim 1, wherein said reflective coating is about 40 nanometers thick or less.

4. The optical storage medium of claim 1, wherein said reflective coating is about 30 nanometers thick or less.

5. The optical storage medium of claim 1, wherein said first layer is about 1.1 mm thick.

6. The optical storage medium of claim 1, wherein said pattern of features includes a spiral groove.

7. The optical storage medium of claim 3, wherein said pattern of features includes a spiral groove.

8. An optical storage medium, comprising:
a first layer having a pattern of features in at least one major surface;
a reflective coating;
said reflective coating including a metal alloy, said metal alloy including silver and scandium, wherein the relationship between the amounts of silver and scandium in the metal alloy is defined by $Ag_xSc_w$ where $0.9500<x<0.9999$ and $0.0001<w<0.05$, wherein said reflective coating is about 60 nanometers thick or less.

9. The optical storage medium of claim 8, wherein $0.001<w<0.03$.

10. The optical storage medium of claim 8, wherein said reflective coating is about 40 nanometers thick or less.

11. The optical storage medium of claim 8, wherein said reflective coating is about 30 nanometers thick or less.

12. The optical storage medium of claim 8, wherein said first layer is about 1.1 mm thick.

13. The optical storage medium of claim 8, wherein said pattern of features includes a spiral groove.

14. The optical storage medium of claim 10, wherein said pattern of features includes a spiral groove.

15. An optical storage medium, comprising:
a first layer having a pattern of features in at least one major surface;
a reflective coating;
said reflective coating including a metal alloy, said metal alloy including silver and bismuth, wherein the relationship between the amounts of silver and bismuth in the metal alloy is defined by $Ag_xBi_w$ where $0.9500<x<0.9999$ and $0.0001<w<0.05$, wherein said reflective coating is about 60 nanometers thick or less.

16. The optical storage medium of claim 15, wherein $0.001<w<0.03$.

17. The optical storage medium of claim 15, wherein said reflective coating is about 40 nanometers thick or less.

18. The optical storage medium of claim 15, wherein said reflective coating is about 30 nanometers thick or less.

19. The optical storage medium of claim 15, wherein said first layer is about 1.1 mm thick.

20. The optical storage medium of claim 15, wherein said pattern of features includes a spiral groove.

21. The optical storage medium of claim 17, wherein said pattern of features includes a spiral groove.

22. An optical storage medium, comprising:
a first layer having a pattern of features in at least one major surface;
a reflective coating;
said reflective coating including a said metal alloy including silver, copper, and element A, where A is selected from the group of elements consisting of yttrium, scandium, or bismuth, wherein the relationship between the amounts of silver, copper, and element A in the metal alloy is defined by $Ag_xCu_zA_w$ where $0.85<x<0.9998$, $0.0001<z<0.10$, and $0.0001<w<0.05$, wherein said reflective coating is about 60 nanometers thick a less.

23. The optical storage medium of claim 22, wherein $0.001<w<0.03$.

24. The optical storage medium of claim 22, wherein said reflective coating is about 40 nanometers thick or less.

25. The optical storage medium of claim 22, wherein said reflective coating is about 30 nanometers thick or less.

26. The optical storage medium of claim 22, wherein said first layer is about 1.1 nm thick.

27. The optical storage medium of claim 22, wherein said pattern of features includes a spiral groove.

28. The optical storage medium of claim 24, wherein said pattern of features includes a spiral groove.

29. An optical storage medium, comprising:
a first layer having a pattern of features in at least one major surface;
a reflective coating;
said reflective coating including a metal alloy, said metal alloy including silver, copper, and magnesium, wherein the relationship between the amounts of silver, copper, and magnesium in the metal alloy is defined by $Ag_xCu_zMg_w$ where $0.85<x<0.9998$, $0.0001<z<0.10$, and $0.0001<w<0.05$, wherein said reflective coating is about 60 nanometers thick or less.

30. The optical storage medium of claim 29, wherein $0.001<w<0.03$.

31. The optical storage medium of claim 29, wherein said reflective coating is about 40 nanometers thick or less.

32. The optical storage medium of claim 29, wherein said reflective coating is about 30 nanometers thick or less.

33. The optical storage medium of claim 29, wherein said first layer is about 1.1 mm thick.

34. The optical storage medium of claim 29, wherein said pattern of features includes a spiral groove.

35. The optical storage medium of claim 31, wherein said pattern of features includes a spiral groove.

36. An optical storage medium, comprising:
a first layer having a pattern of features in at least one major surface;
a reflective coating;

said reflective coating including a metal alloy, said metal alloy including silver, copper, and cobalt, wherein the relationship between the amounts of silver, copper, and cobalt in the metal alloy is defined by $Ag_xCu_zCo_w$, where $0.85<x<0.9998$, $0.0001<z<0.10$, and $0.0001<w<0.05$, wherein said reflective coating is about 60 nanometers thick or less.

37. The optical storage medium of claim 36, wherein $0.001<w<0.03$.

38. The optical storage medium of claim 36, wherein said reflective coating is about 40 nanometers thick or less.

39. The optical storage medium of claim 36, wherein said reflective coating is about 30 nanometers thick or less.

40. The optical storage medium of claim 36, wherein said first layer is about 1.1 mm thick.

41. The optical storage medium of claim 36, wherein said pattern of features includes a spiral groove.

42. The optical storage medium of claim 38, wherein said pattern of features includes a spiral groove.

43. An optical storage medium, comprising:
   a first layer having a pattern of features in at least one major surface;
   a reflective coating;
   said reflective coating including a metal alloy, said metal alloy including silver, zinc, and magnesium wherein the relationship between the amounts of silver, zinc, and magnesium in the metal alloy is defined by $Ag_xZn_yMg_w$ where $0.8000<x<0.9998$, $0.0001<y<0.15$, and $0.0001<w<0.05$, wherein said reflective coating is about 60 nanometers thick or less.

44. The optical storage medium of claim 43, wherein $0.001<w<0.03$.

45. The optical storage medium of claim 43, wherein said reflective coating is about 40 nanometers thick or less.

46. The optical storage medium of claim 43, wherein said reflective coating is about 30 nanometers thick or less.

47. The optical storage medium of claim 43, wherein said first layer is about 1.1 mm thick.

48. The optical storage medium of claim 43, wherein said pattern of features includes a spiral groove.

49. The optical storage medium of claim 45, wherein said pattern of features includes a spiral groove.

50. An optical storage medium, comprising:
   a first layer having a pattern of features in at least one major surface;
   a reflective coating;
   said reflective coating including a metal alloy, said metal alloy including silver, zinc, and cobalt, wherein, the relationship between the amounts of silver, zinc, and cobalt in the metal alloy is defined by $Ag_xZn_yCo_w$, where $0.8000<x<0.9998$, $0.0001<y<0.15$, and $0.0001<w<0.05$, wherein said reflective coating is about 60 nanometers thick or less.

51. The optical storage medium of claim 50, wherein $0.001<w<0.03$.

52. The optical storage medium of claim 50, wherein said reflective coating is about 40 nanometers thick or less.

53. The optical storage medium of claim 50, wherein said reflective coating is about 30 nanometers thick or less.

54. The optical storage medium of claim 50, wherein said first layer is about 1.1 mm thick.

55. The optical storage medium of claim 50, wherein said pattern of features includes a spiral groove.

56. The optical storage medium of claim 52, wherein said pattern of features includes a spiral groove.

* * * * *